(12) United States Patent
Jung et al.

(10) Patent No.: US 12,094,924 B2
(45) Date of Patent: Sep. 17, 2024

(54) CAPACITOR STRUCTURE, SEMICONDUCTOR MEMORY DEVICE INCLUDING THE SAME, METHOD FOR FABRICATING THE SAME, AND METHOD FOR FABRICATING SEMICONDUCTOR MEMORY DEVICE INCLUDING THE SAME

(71) Applicant: Samsung Electronics Co., Ltd., Suwon-si (KR)

(72) Inventors: Kyoo Ho Jung, Seoul (KR); Sang Yeol Kang, Yongin-si (KR); Su Hwan Kim, Seoul (KR); Dong Kwan Baek, Seoul (KR); Yu Kyung Shin, Hwaseong-si (KR); Won Sik Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 237 days.

(21) Appl. No.: 17/567,316

(22) Filed: Jan. 3, 2022

(65) Prior Publication Data
US 2023/0008127 A1 Jan. 12, 2023

(30) Foreign Application Priority Data
Jul. 6, 2021 (KR) .................... 10-2021-0088511

(51) Int. Cl.
*G11C 11/402* (2006.01)
*H01L 49/02* (2006.01)
*H10B 12/00* (2023.01)

(52) U.S. Cl.
CPC .......... *H01L 28/65* (2013.01); *G11C 11/4023* (2013.01); *H10B 12/30* (2023.02)

(58) Field of Classification Search
CPC ......... H01L 28/40; H01L 28/55; H01L 28/56; H01L 28/57; H01L 28/65; H01L 28/75; H10B 12/30; G11C 11/4023
See application file for complete search history.

(56) References Cited

U.S. PATENT DOCUMENTS 8,541,283 B2  9/2013  Malhotra et al.
8,541,828 B2  9/2013  Hashim et al.
(Continued)

FOREIGN PATENT DOCUMENTS

CN    112071981 A  * 12/2020   ....... H01L 21/02172
CN    112750833 A    5/2021
(Continued)

OTHER PUBLICATIONS

Taiwanese Office Action dated May 10, 2023 issued in Taiwanese Patent Application No. 111120265.

*Primary Examiner* — Matthew E Warren
(74) *Attorney, Agent, or Firm* — HARNESS, DICKEY & PIERCE, P.L.C.

(57) ABSTRACT

A capacitor structure, a semiconductor memory device including the same, a method for fabricating the same, and a method for fabricating a semiconductor device including the same are provided. The capacitor structure includes a lower electrode, an upper electrode, and a capacitor dielectric film which is interposed between the lower electrode and the upper electrode, wherein the lower electrode includes an electrode film including a first metal element, and a doping oxide film including an oxide of the first metal element between the electrode film and the capacitor dielectric film, and the doping oxide film further includes a second metal element including at least one of Group 5 to Group 11 and Group 15 metal elements, and an impurity element including at least one of silicon (Si), aluminum (Al), zirconium (Zr) and hafnium (Hf).

16 Claims, 19 Drawing Sheets

(56) References Cited

U.S. PATENT DOCUMENTS

| | | | |
|---|---|---|---|
| 8,652,927 | B2 | 2/2014 | Malhotra et al. |
| 8,679,939 | B2 | 3/2014 | Malhotra et al. |
| 8,809,160 | B2 | 8/2014 | Chen et al. |
| 8,828,821 | B2 | 9/2014 | Chen et al. |
| 9,082,782 | B2 | 7/2015 | Chen et al. |
| 9,343,298 | B2 | 5/2016 | Popovici et al. |
| 2016/0133691 | A1 | 5/2016 | Phatak et al. |
| 2020/0020780 | A1* | 1/2020 | Kim .................... H01L 29/4966 |
| 2020/0335333 | A1* | 10/2020 | Kang ...................... H01L 28/40 |
| 2020/0395436 | A1 | 12/2020 | Jung et al. |
| 2021/0134804 | A1 | 5/2021 | Jung et al. |

FOREIGN PATENT DOCUMENTS

| | | |
|---|---|---|
| KR | 10-2022-0037041 A | 3/2022 |
| TW | 202105528 A | 2/2021 |

* cited by examiner

192(32)

32 34 36
192(30)

CAPACITOR STRUCTURE, SEMICONDUCTOR MEMORY DEVICE INCLUDING THE SAME, METHOD FOR FABRICATING THE SAME, AND METHOD FOR FABRICATING SEMICONDUCTOR MEMORY DEVICE INCLUDING THE SAME

This application claims priority to Korean Patent Application No. 10-2021-0088511, filed on Jul. 6, 2021, and all the benefits accruing therefrom under 35 U.S.C. § 119, the disclosure of which is incorporated herein by reference in its entirety.

BACKGROUND

Inventive concepts relate to a capacitor structure, a semiconductor memory device including the same, a method for fabricating the same, and/or a method for fabricating a semiconductor device including the same.

As semiconductor memory devices become gradually integrated, individual circuit patterns become finer to implement more semiconductor memory devices in the same area. Although an aspect ratio of individual circuit patterns gradually increases to compensate for this, the increased aspect ratio increases a process difficulty and/or causes defects such as a pattern collapse.

SUMMARY

Aspects of inventive concepts provide a capacitor structure having improved capacitance and/or reduced stress.

Alternatively or additionally, aspects of inventive concepts also provide a semiconductor memory device including a capacitor structure having an improved capacitance and/or a reduced stress.

Alternatively or additionally, aspects of inventive concepts also provide a method for fabricating a capacitor structure having an improved capacitance and/or a reduced stress.

Alternatively or additionally, aspects of inventive concepts also provide a method for fabricating a semiconductor memory device including a capacitor structure having an improved capacitance and a reduced stress.

However, aspects of inventive concepts are not restricted to the one set forth herein. The above and other aspects of inventive concepts will become more apparent to one of ordinary skill in the art to which inventive concepts pertains by referencing the detailed description of inventive concepts given below.

According to some example embodiments of inventive concepts, there is provided a capacitor structure including a lower electrode, an upper electrode, and a capacitor dielectric film between the lower electrode and the upper electrode. The lower electrode includes an electrode film including a first metal element, and the lower electrode includes a doping oxide film including an oxide of the first metal element between the electrode film and the capacitor dielectric film, and the doping oxide film further includes a second metal element including an impurity element including at least one of silicon (Si), aluminum (Al), zirconium (Zr) and hafnium (Hf), and the doping oxide film includes at least one of Group 5 to Group 11 or Group 15 metal elements.

According to some example embodiments of inventive concepts, there is provided a capacitor structure including a lower electrode, an upper electrode, and a capacitor dielectric film between the lower electrode and the upper electrode. The lower electrode includes an electrode film including a first metal element, the lower electrode includes a metal oxide film including an oxide of the first metal element between the electrode film and the capacitor dielectric film, and the lower electrode includes a doping oxide film including an oxide of the first metal element doped with a second metal element, the doping oxide film between the metal oxide film and the capacitor dielectric film, and the doping oxide film further includes silicon (Si) of 0.3 atomic % or less.

According to some example embodiments of inventive concepts, there is provided a semiconductor memory device including a substrate including an active region, a first conductive line on the substrate, the first conductive line extending in a first direction and connected to the active region, a capacitor contact on the substrate and spaced apart from the first conductive line and connected to the active region, a second conductive line on the active region between the first conductive line and the capacitor contact, the second conductive line extending in a second direction intersecting the first direction, and a capacitor structure which includes a lower electrode connected to the capacitor contact, the capacitor structure including a capacitor dielectric film and an upper electrode sequentially that are stacked on the lower electrode. The lower electrode includes an electrode film including a first metal element, and the lower electrode includes a doping oxide film including an oxide of the first metal element doped with a second metal element, the doping oxide film between the electrode film and the capacitor dielectric film, and the doping oxide film further includes an impurity element including at least one of silicon (Si), aluminum (Al), zirconium (Zr) and hafnium (Hf).

According to some example embodiments of inventive concepts, there is provided a method for fabricating a capacitor structure, the method including forming a metal oxide film including an oxide of the first metal element, the metal oxide film formed on the electrode film, forming a blocking film including at least one of silicon oxide, aluminum oxide, zirconium oxide and hafnium oxide, the blocking film formed on the metal oxide film, forming a dopant film including a second metal element, the second metal element including at least one of Group 5 to Group 11 and Group 15 metal elements, the dopant film formed on the blocking film, performing a heat treatment process to form a doping oxide film including an oxide of the first metal element doped with the second metal element, and forming a capacitor dielectric film and an upper electrode which are sequentially stacked on the doping oxide film.

BRIEF DESCRIPTION OF THE DRAWINGS

The above and other aspects and features of inventive concepts will become more apparent by describing in detail example embodiments thereof with reference to the attached drawings, in which.

DETAILED DESCRIPTION OF SOME EXAMPLE EMBODIMENTS

Hereinafter, a capacitor structure according to some example embodiments will be described referring to FIGS. 1 to 3B.

Figure 1:
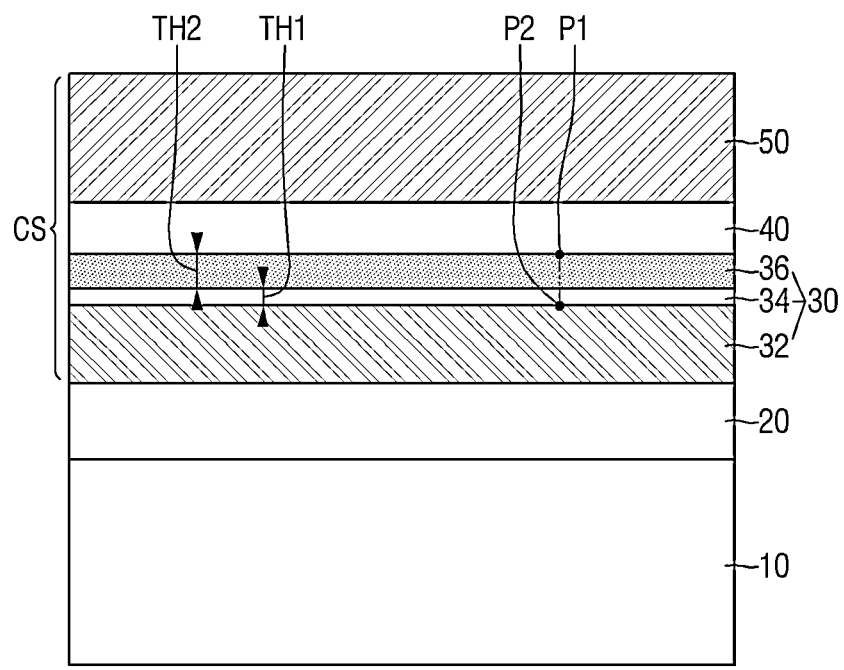
FIG. 1 is an example cross-sectional view for explaining a capacitor structure according to some embodiments.
Figure 2A:
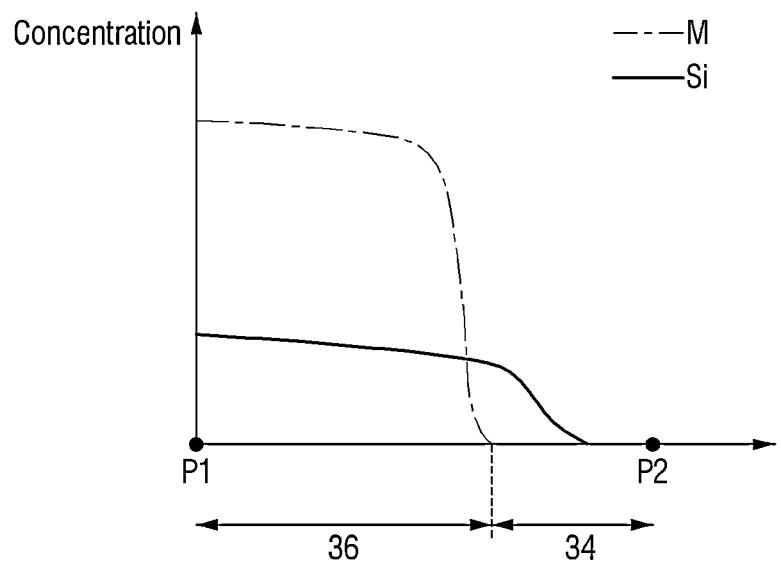
FIGS. 2A and 2B are example graphs for explaining a lower electrode of FIG. 1.
Figure 2B:
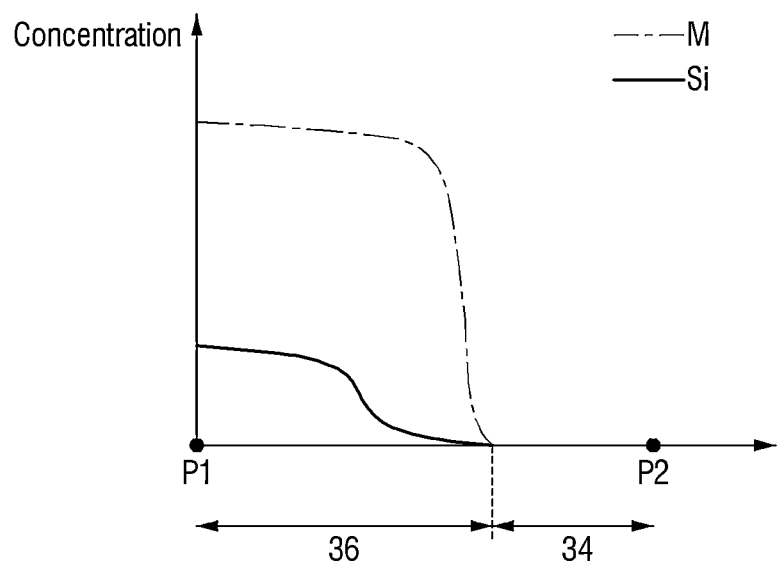

FIG. 1 is an example cross-sectional view for explaining a capacitor structure according to some example embodiments. FIGS. 2A and 2B are example graphs for explaining a lower electrode of FIG. 1.

Referring to FIGS. 1 to 2B, a capacitor structure CS according to some example embodiments is formed on a substrate 10 and a lower insulating film 20.

The substrate 10 may be or may include a bulk silicon or a SOI (silicon-on-insulator). Alternatively or additionally, the substrate 10 may be or may include a silicon substrate or may include other substances, for example, silicon germanium, SGOI (silicon germanium on insulator), indium antimonide, lead tellurium compounds, indium arsenic, indium phosphide, gallium arsenide or gallium antimonide. The substrate 10 may be single-crystal and/or may be doped, e.g. may be lightly doped with impurities such as boron; however, example embodiments are not limited thereto.

The lower insulating film 20 may be formed on the substrate 10. The lower insulating film 20 may include, for example, at least one of silicon oxide, silicon nitride, silicon oxynitride, and a low dielectric constant (low-k) material having a lower dielectric constant than silicon oxide. The low dielectric constant material may include, for example, but is not limited to, at least one of FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric materials, and combinations thereof.

The capacitor structure CS includes a lower electrode 30, a capacitor dielectric film 40, and an upper electrode 50. The lower electrode 30, the capacitor dielectric film 40, and the upper electrode 50 may be sequentially stacked on the substrate 10 and the lower insulating film 20. The capacitor structure CS may store an electric charge, such as electrons, in the capacitor dielectric film 40 by utilizing a potential difference generated between the lower electrode 30 and the upper electrode 50.

The lower electrode 30 may include an electrode film 32, a metal oxide film 34, and a doping oxide film 36. The electrode film 32, the metal oxide film 34 and the doping oxide film 36 may be sequentially stacked on the substrate 10 and the lower insulating film 20.

The electrode film 32 may include a first metal element. The first metal element may include, for example, but is not limited to, at least one of titanium (Ti), tantalum (Ta), tungsten (W), and ruthenium (Ru). In some example embodiments, the electrode film 32 may include a nitride of the first metal element. As an example, the electrode film 32 may include at least one of titanium nitride, tantalum nitride, tungsten nitride, or ruthenium nitride.

The metal oxide film 34 may be formed on the electrode film 32. The metal oxide film 34 may be interposed between the electrode film 32 and the doping oxide film 36. The metal oxide film 34 may include an oxide of the first metal element. As an example, when the first metal element is titanium (Ti), the metal oxide film 34 may include titanium oxide. The metal oxide film 34 may be formed by, but is not limited to, an oxidation process on the electrode film 32, e.g. a process wherein at least portion of the electrode film 32 is consumed and converted to a metal oxide. Alternatively or additionally, the metal oxide film 34 may be a natural oxide film/native oxide film of the electrode film 32. A thickness TH1 of the metal oxide film 34 may be, for example, about 10 Å or less (0.1 nm or less).

The doping oxide film 36 may be formed on the metal oxide film 34. The doping oxide film 36 may be interposed between the metal oxide film 34 and the capacitor dielectric film 40. The doping oxide film 36 may include an oxide of the first metal element doped with a second metal element. As an example, the doping oxide film 36 may include titanium oxide doped with the second metal element. The doping oxide film 36 may be formed by a doping process of the second metal element on the oxide of the first metal element. For example, the doping oxide film 36 may include an oxide of the first metal element doped with the second metal element at a predetermined concentration (e.g., 0.01 atomic % or more). A thickness TH2 of the doping oxide film 36 may be, for example, about 10 Å or less (1 nm or less). In some example embodiments, the thickness TH1 of the metal oxide film 34 may be less than the thickness TH2 of the doping oxide film 36.

In some example embodiments, the second metal element may include at least one of a Group 5 to Group 11 element or a Group 15 metal element. For example, the second metal element may include, but is not limited to, at least one of antimony (Sb) (group 15), molybdenum (Mo) (group 6), cobalt (Co) (group 9), niobium (Nb) (group 5), copper (Cu) (group 11), nickel (Ni) (group 10), and tantalum (Ta) (group 5).

The doping oxide film 36 may further include an impurity element. The impurity element may include at least one of silicon (Si), aluminum (Al), zirconium (Zr), and hafnium (Hf). As an example, the doping oxide film 36 may include titanium oxide doped with the second metal element and silicon (Si). The impurity element of the doping oxide film 36 may prevent or reduce the likelihood of and/or impact from the electrode film 32 or the metal oxide film 34 from being excessively oxidized in the process of being doped with the second metal element to reduce a stress applied to the capacitor structure CS. This will be described more specifically in the description of FIGS. 15 to 21.

As an example, the doping oxide film 36 may include at least one of a $TiSiNbO_2$ film, a TiSiNbON film, a TiSiNbN film, a $HfTiSiNbO_2$ film, a HfTiSiNbON film, and a HfTiSiNbN film.

In some example embodiments, the doping oxide film 36 may include the second metal element of about 10 atomic % or less. For example, the content of the second metal element in the doping oxide film 36 may be about 0.01 atomic % to about 10 atomic %. As an example, the content of the second metal element may be about 0.01 atomic % to about 1 atomic %.

In some example embodiments, the content of the second metal element inside the doping oxide film 36 may be constant or decrease in a direction going away from the upper side of the doping oxide film 36. The vertical axis in FIGS. 2A and 2B are in arbitrary units, and may be exponential; however, example embodiments are not limited thereto. The concentrations illustrated in FIGS. 2A and 2B may be determined by one or more analytical techniques, such as but not limited to secondary ion mass spectroscopy (SIMS) and/or transmission electron microscopy (TEM); however, example embodiments are not limited thereto. As an example, as shown in FIGS. 2A and 2B, the concentration of the second metal element (M of FIGS. 2A and 2B) inside the doping oxide film 36 may be substantially constant and then decrease in a direction going away from one point P1 of the upper side of the doping oxide film 36. The metal oxide film 34 may not include the second metal element or may include a trace amount of the second metal element. For example, the metal oxide film 34 may be a region in which the second metal element is not diffused or is minimally or partially or prohibitively diffused in the doping process of the second metal element.

In some example embodiments, the content of the second metal element in the doping oxide film 36 may be greater than the content of the impurity element in the doping oxide film 36.

In some example embodiments, the doping oxide film 36 may include the impurity elements of about 0.5 atomic % or less. For example, the content of the impurity element in the doping oxide film 36 may be about 0.01 atomic % to about 0.5 atomic %. As an example, the content of the impurity element may be about 0.01 atomic % to about 0.3 atomic %.

In some example embodiments, the content of the impurity element in the doping oxide film 36 may be constant or decrease in a direction going away from the upper side of the doping oxide film 36. As an example, as shown in FIGS. 2A and 2B, the concentration of the impurity element (Si of FIGS. 2A and 2B) in the doping oxide film 36 may be substantially constant and then decrease in a direction going away from one point P1 on the upper side of the doping oxide film 36.

In some example embodiments, at least a part of the metal oxide film 34 may include the impurity element. As an example, as shown in FIG. 2A, a part of the metal oxide film 34 adjacent to the doping oxide film 36 may include the impurity element. For example, the impurity elements may be diffused up to the metal oxide film 34.

In some example embodiments, the metal oxide film 34 may not include the impurity element (Si of FIG. 2B), as shown in FIG. 2B. For example, the impurity element may not be diffused up to the metal oxide film 34.

The capacitor dielectric film 40 may be formed on the lower electrode 30. The capacitor dielectric film 40 may be interposed between the lower electrode 30 and the upper electrode 50. The capacitor dielectric film 40 may include, for example, at least one of silicon oxide, silicon nitride, silicon oxynitride, and a high dielectric constant (high-k) material having a higher dielectric constant than silicon oxide. The high dielectric constant material may include, for example, but is not limited to, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. As an example, the capacitor dielectric film 40 may include at least one of aluminum oxide, zirconium oxide, and hafnium oxide.

The capacitor dielectric film 40 may include a single layer or multiple layers of the aforementioned materials. As an example, the capacitor dielectric film 40 may include a hafnium oxide film (HfO film) and a ZAZA ($ZrO_2/Al_2O_3/ZrO_2/Al_2O_3$) film stacked on the lower electrode 30.

The upper electrode 50 may be formed on the capacitor dielectric film 40. The upper electrode 50 may include, for example, at least one of titanium, titanium nitride, tantalum, tantalum nitride, tungsten, tungsten nitride, and ruthenium. In some example embodiments, the upper electrode 50 may include the first metal element. As an example, the upper electrode 50 may include titanium nitride.

The capacitor structure CS according to some example embodiments has an improved capacitance by including a doping oxide film 36. For example, the metal oxide film 34 including titanium oxide and/or the like forms a depletion region when a voltage (e.g., a negative voltage) is applied to the lower electrode 30, which causes a decrease in capacitance of the capacitor structure CS. However, as described above, the doping oxide film 36 is interposed between the metal oxide film 34 and the capacitor dielectric film 40, and may reduce the formation of the depletion region due to the metal oxide film 34. Further, as described above, the doping oxide film 36 may include at least one of Group 5 to Group 11 and Group 15 metal elements. Accordingly, the capacitor dielectric film 40 formed on the doping oxide film 36 may have an improved dielectric constant, for example by including both a tetragonal crystal system and an orthorhombic crystal system. Accordingly, it may be possible to provide a capacitor structure CS having an improved capacitance.

Alternatively or additionally, in the capacitor structures CS according to some example embodiments, the doping oxide film 36 has a reduced stress, by including the aforementioned impurity element to minimize or reduce the likelihood of and/or impact from the formation of the metal oxide film 34. For example, the electrode film 32 or the metal oxide film 34 may be excessively oxidized in the process of being doped with the second metal element to form an oxide film of an excessive thickness, which may cause an increase in stress applied to the capacitor structure CS. However, as described above, the impurity element of the doping oxide film 36 may prevent or reduce the likelihood of and/or impact from the metal oxide film 34 from being excessively oxidized in the process of being doped with the second metal element. Accordingly, it may be possible to provide capacitor structure CS having a reduced stress.

Figure 3A:
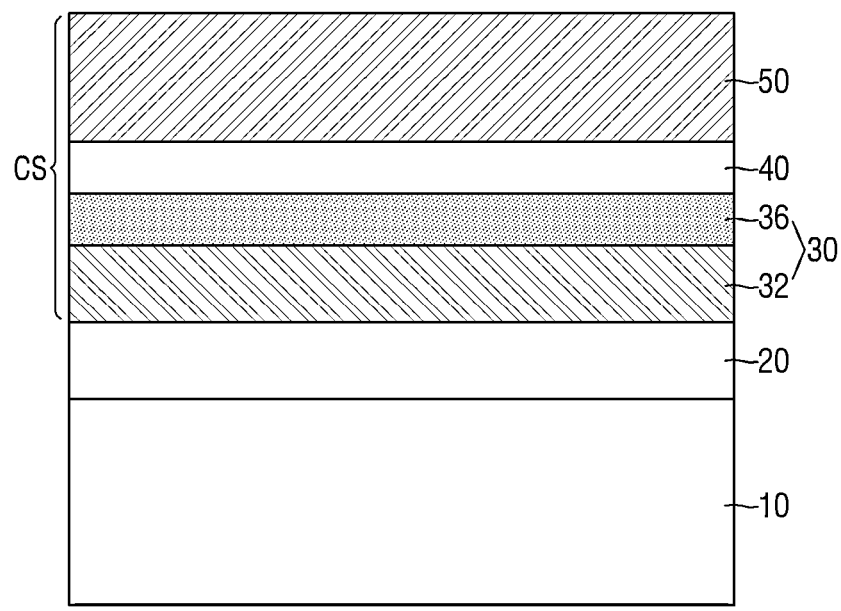
FIGS. 3A and 3B are other example cross-sectional views for explaining a capacitor structure according to some example embodiments.
Figure 3B:
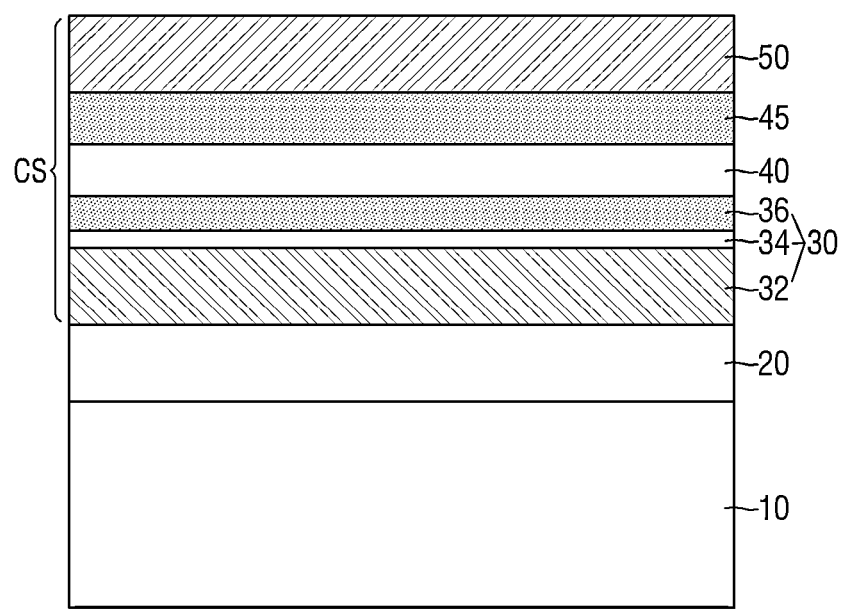

FIGS. 3A and 3B are example cross-sectional views for explaining a capacitor structure according to some example embodiments. For convenience of explanation, repeated parts of contents explained above using FIGS. 1 to 2b will be briefly explained or omitted.

Referring to FIG. 3A, in the capacitor structure CS according to some example embodiments, the lower electrode 30 includes an electrode film 32 and a doping oxide film 36.

The lower electrode 30 may not include the metal oxide film 34 explained above using FIG. 1. For example, all oxides of the first metal element may be doped with the second metal element in the doping process of the second metal element. In such a case, the doping oxide film 36 may be formed just above/just on the electrode film 32.

As an example, the electrode film 32 may include a titanium nitride film (TiN film), and the doping oxide film 36 may include at least one of a $TiSiNbO_2$ film, a TiSiNbON film, a TiSiNbN film, a $HfTiSiNbO_2$ film, a HfTiSiNbON film, and a HfTiSiNbN film.

Referring to FIG. 3B, the capacitor structure CS according to some example embodiments further includes an upper interface film 45.

The upper interface film 45 may be interposed between the capacitor dielectric film 40 and the upper electrode 50. The upper interface film 45 may be formed by, but is not limited to, diffusion of a portion of elements included in the capacitor dielectric film 40 to the upper electrode 50. For example, the upper interface film 45 may be formed by oxidation of (e.g. thermal oxidation of) a portion of the upper electrode 50 adjacent to the capacitor dielectric film 40. As an example, the upper electrode may include a titanium nitride film (TiN film), and the upper interface film 45 may include at least one of a $TiO_2$ film, a TiON film, and a AlTiON film. Alternatively or additionally, the upper interface film 45 may be formed by deposition process.

In some example embodiments, the upper interface film 45 may be doped with a third metal element, for example during oxidation and/or deposition and/or with an implantation process. The third metal element may include at least one of Group 5 to Group 11 and Group 15 metal elements. For example, the third metal element may include, but is not limited to, at least one of antimony (Sb), molybdenum (Mo), cobalt (Co), niobium (Nb), copper (Cu), nickel (Ni), and tantalum (Ta). As an example, the third metal element may be niobium (Nb). As an example, the upper electrode may include a titanium nitride film (TiN film), and the upper interface film 45 may include at least one of a $TiNbO_2$ film, a TiNbON film, and an AlTiNbON film.

In FIG. 3B, although only the capacitor structure CS including the metal oxide film 34 is shown, this is just an example. In some example embodiments, the capacitor structure CS may not include the metal oxide film 34, as described above with respect to FIG. 3A.

As an example, the capacitor structure CS according to some example embodiments may include a first titanium nitride film (a first TiN film), a first titanium oxide film (a first TiO film), a silicon oxide film (a SiO film), a first niobium oxide film (a first NbO film), a hafnium oxide film (a HfO film), a ZAZA ($ZrO_2/Al_2O_3/ZrO_2/Al_2O_3$) film, a second titanium oxide film (a second TiO film), and a second titanium nitride film (a second TiN film) which are stacked sequentially on the substrate 10 and the lower insulating film 20.

As an example, the capacitor structure CS according to some example embodiments may include a first titanium nitride film (a first TiN film), a first titanium oxide film (a first TiO film), a silicon oxide film (a SiO film), a first niobium oxide film (a first NbO film), a hafnium oxide film (a HfO film), a ZAZA ($ZrO_2/Al_2O_3/ZrO_2/Al_2O_3$) film, a second titanium oxide film (a second TiO film), a second niobium oxide film (a second NbO), and a second titanium nitride film (a second TiN film) which are stacked sequentially on the substrate 10 and the lower insulating film 20.

In some example embodiments, the thickness of the first titanium oxide film (the first TiO film) may be smaller than the thickness of the silicon oxide film (the SiO film).

In some example embodiments, the thickness of the first titanium oxide film (the first TiO film) may be smaller than/less than the thickness of the first niobium oxide film (the first NbO film).

In some example embodiments, the thickness of the first titanium oxide film (the first TiO film) may be smaller than/less than the sum of the thickness of the silicon oxide film (the SiO film) and the thickness of the first niobium oxide film (the first NbO film).

Hereinafter, a semiconductor memory device according to some example embodiments will be described referring to FIGS. 1 to 14.

Figure 4:
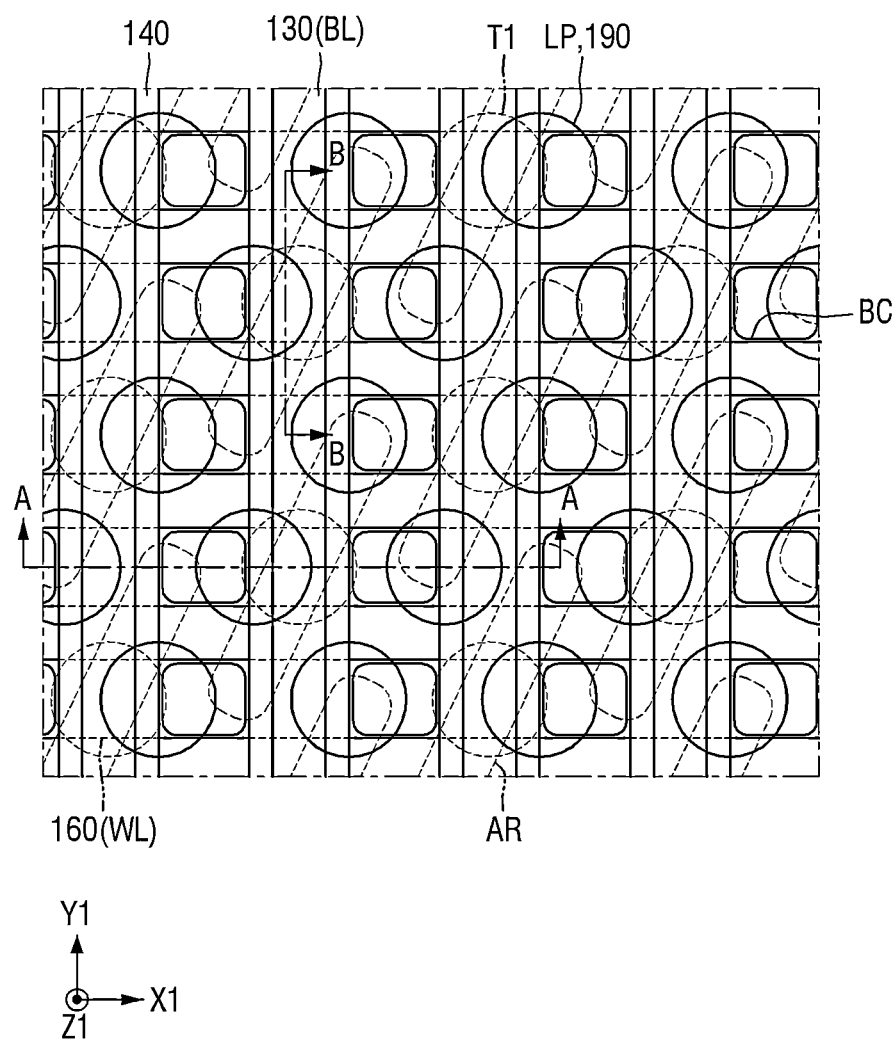
FIG. 4 is an example layout diagram for explaining the semiconductor memory device according to some example embodiments.
Figure 5:
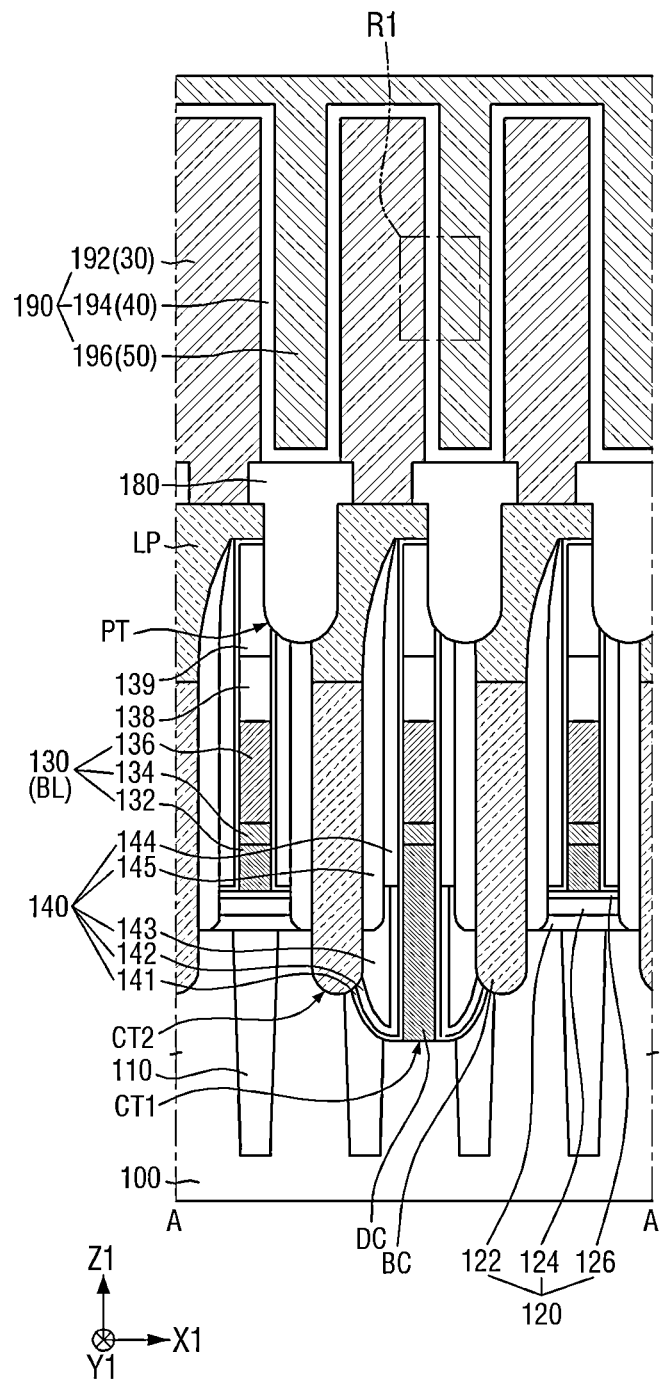
FIG. 5 is a cross-sectional view taken along A-A of FIG. 4.
Figure 6:
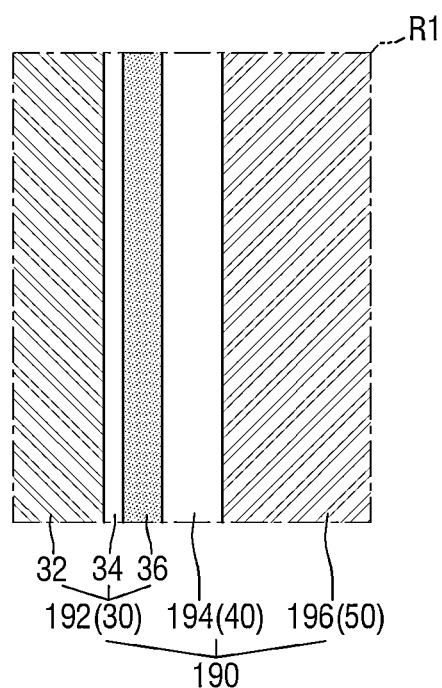
FIG. 6 is an enlarged view for explaining a region R1 of FIG. 5.
Figure 7:
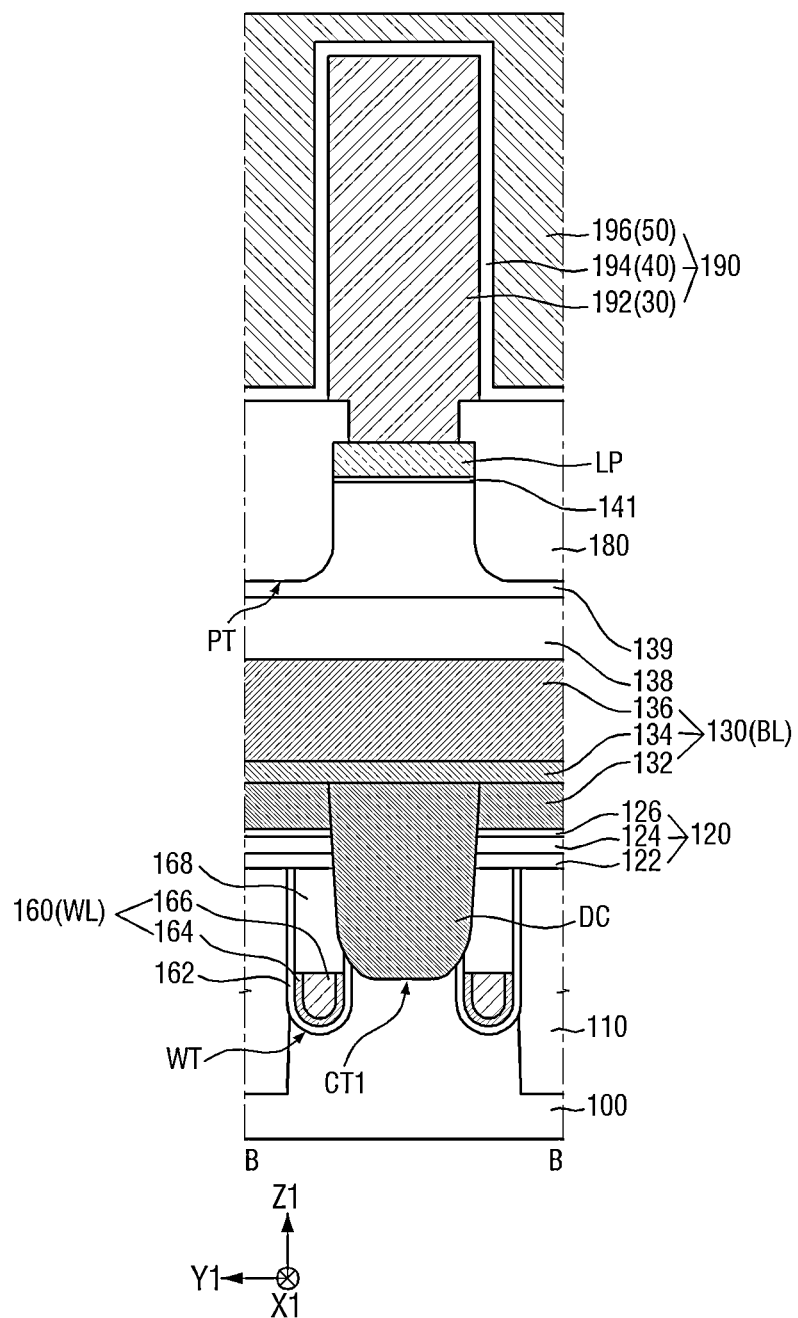
FIG. 7 is a cross-sectional view taken along B-B of FIG. 4.

FIG. 4 is an example layout diagram for explaining the semiconductor memory device according to some example embodiments. FIG. 5 is a cross-sectional view taken along A-A of FIG. 4. FIG. 6 is an enlarged view for explaining a region R1 of FIG. 5. FIG. 7 is a cross-sectional view taken along B-B of FIG. 4. For convenience of explanation, repeated parts of contents explained above using FIGS. 1 to 3 will be briefly explained or omitted.

Referring to FIGS. 4 to 7, the semiconductor memory device according to some example embodiments includes a first substrate 100, a first element isolation film 110, a base insulating film 120, a first conductive line 130 (BL), e.g. a column, a direct contact (DC), e.g. a digit contact, a spacer structure 140, a second conductive line 160 (WL), e.g., a row, a first gate dielectric film 162, a first capacitor contact (BC, LP), and a first capacitor structure 190.

The first substrate 100 may have, but is not limited to, a structure in which a base substrate and an epitaxial layer are stacked. The first substrate 100 may be or may include a silicon substrate, a gallium arsenide substrate, a silicon germanium substrate, or an SOI (Semiconductor On Insulator) substrate. The first substrate 100 may be lightly doped; however, example embodiments are not limited thereto. As an example, the first substrate 100 will be described below as a silicon substrate, e.g. a single-crystal silicon substrate.

The first substrate 100 may include a first active region AR. The first active region AR may be in the form of a plurality of bars extending in directions parallel to each other. Further, a center of one of the plurality of first active regions AR may be placed to be adjacent to a terminal portion of the other first active regions AR. In some example embodiments, the first active region AR may be formed in the form of a diagonal bar. For example, as shown in FIG. 4, the first active region AR may be in the form of a bar extending in a third direction different from the first direction Y1 and the first direction Y1 in the plane in which the first direction Y1 and the second direction X1 extend. An acute angle formed by the second direction X1 and the third direction may be, for example, but is not limited to, 60°.

The first active region AR may function as or may be a source/drain region and may include impurities such as but not limited to phosphorus and/or arsenic. In some example embodiments, a first portion (e.g., a central portion of the first active region AR) may be connected to the first conductive line 130 by the direct contact DC, and a second portion (e.g., both end portions) of the active region AR may be connected to the first capacitor structure 190 by the first capacitor contact BC, LP.

The first element isolation film 110 may define a plurality of first active regions AR. In FIGS. 5 and 7, although side faces of the first element isolation film 110 are shown to have an inclination, this is only a process feature, and example embodiments are not limited thereto.

The first element isolation film 110 may include, but is not limited to, at least one of silicon oxide, silicon nitride and silicon oxynitride. The first element isolation film 110 may also be a single film made up of one kind of insulating material, and may also be multiple films made up of a combination of various kinds of insulating materials.

The base insulating film 120 may be formed on the first substrate 100 and the first element isolation film 110. In some example embodiments, the base insulating film 120 may extend along the upper side of the first substrate 100 and the upper side of the first element isolation film 110 in the region in which the direct contact DC and the buried contact BC are not formed.

The base insulating film 120 may be a single film, but may also be multiple films as shown. As an example, the base insulating film 120 may include a first insulating film 122, a second insulating film 124, and a third insulating film 126 which are sequentially stacked on the first substrate 100. The first insulating film 122 may include, for example, a silicon oxide. The second insulating film 124 may include a substance having an etching selectivity different from, e.g. slower than or faster than, the first insulating film 122. For example, the second insulating film 124 may include silicon nitride. The third insulating film 126 may include a substance having a smaller dielectric constant than the second insulating film 124. For example, the third insulating film 126 may include a silicon oxide.

The first conductive line 130 may be formed on the first substrate 100, the first element isolation film 110, and the base insulating film 120. The first conductive line 130 may extend long in the first direction Y1 across the first active region AR and the second conductive line 160. For example, the first conductive line 130 may diagonally cross the first active region AR and vertically across the second conductive line 160. The plurality of first conductive lines 130 are spaced apart from each other and may be arranged at equal intervals along the second direction X1. Each first conductive line 130 may be connected to the first active region AR to function as a bit line BL of the semiconductor memory device according to some example embodiments.

In some example embodiments, the first conductive line 130 may include a first sub-conductive pattern 132, a second sub-conductive pattern 134, and a third sub-conductive pattern 136 which are sequentially stacked on the first substrate 100. The first sub-conductive pattern 132, the second sub-conductive pattern 134, and the third sub-conductive pattern 136 may include, for example, but are not limited to, at least one of polysilicon, TiN, TiSiN, tungsten, tungsten silicide, and combinations thereof. As an example, the first sub-conductive pattern 132 may include polysilicon, the second sub-conductive pattern 134 may include TiSiN, and the third sub-conductive pattern 136 may include tungsten.

In some example embodiments, a first bit line capping pattern 138 and a second bit line capping pattern 139 may be sequentially formed on the first conductive line 130. The first bit line capping pattern 138 and the second bit line capping pattern 139 may extend along the upper side of the first conductive line 130. The first bit line capping pattern 138 and the second bit line capping pattern 139 may include, but are not limited to, silicon nitride.

The direct contact DC may be formed on the first substrate 100 and the first element isolation film 110. The direct contact DC may penetrate the base insulating film 120 to connect the first active region AR of the first substrate 100 and the first conductive line 130. For example, the first substrate 100 may include or define a first contact trench CT1. The first contact trench CT1 may penetrate the base insulating film 120 to expose the first portion (e.g., a central portion) of the first active region AR. The direct contact DC may be formed inside the first contact trench CT1 to connect the first portion of the first active region AR and the first conductive line 130.

In some example embodiments, a part of the first contact trench CT1 may also overlap a part of the first element isolation film 110. Accordingly, the first contact trench CT1 may expose not only a part of the first active region AR but also a part of the first element isolation film 110.

In some example embodiments, the width of the direct contact DC may be smaller than the width of the first contact trench CT1. For example, the direct contact DC may come into contact with only a part of the first substrate 100 exposed by the first contact trench CT1. In some example embodiments, the width of the first conductive line 130 may also be smaller than the width of the first contact trench CT1. For example, the width of the first conductive line 130 may be the same as the width of the direct contact DC.

The direct contact DC may include a conductive material. Accordingly, the first conductive line 130 may be electrically connected to the first active region AR of the first substrate 100. The first portion (e.g., a central portion) of the first active region AR connected to the direct contact DC may function as the first source/drain region of the semiconductor device including the second conductive line 160.

In some example embodiments, the direct contact DC may include the same material as the first sub-conductive pattern 132. For example, the direct contact DC may include polysilicon, e.g. doped polysilicon. However, this is just an example, and the direct contact DC may also include a material different from the first sub-conductive pattern 132 depending on the fabricating process.

The spacer structure 140 may be formed on the side faces of the first conductive line 130. The spacer structure 140 may extend along the side faces of the first conductive line 130. For example, the spacer structure 140 may extend long in the first direction Y1.

In some example embodiments, the spacer structure 140 may include a first spacer 141, a second spacer 142, a third spacer 143, a fourth spacer 144, and a fifth spacer 145.

The first spacer 141 may extend along the side faces of the first conductive line 130. For example, the first spacer 141 may extend along the side faces of the first conductive line 130, the first bit line capping pattern 138 and the second bit line capping pattern 139. In a region in which the first contact trench CT1 is formed, the first spacer 141 may extend the side faces of the first conductive line 130, the side faces of the direct contact DC and the first contact trench CT1. In some example embodiments, the first spacer 141 may come into contact with the first conductive line 130 and the direct contact DC. In a region in which the first contact trench CT1 is not formed, the first spacer 141 may extend along the side faces of the first conductive line 130 and the upper side of the base insulating film 120.

The second spacer 142 may be formed on the first spacer 141 inside the first contact trench CT1. For example, the second spacer 142 may extend along the profile of the first spacer 141 inside the first contact trench CT1.

The third spacer 143 may be formed on the second spacer 142 inside the first contact trench CT1. The third spacer 143 may be fill the region of the first contact trench CT1 that remains after the first spacer 141 and the second spacer 142 are formed.

The fourth spacer 144 may be formed on the second spacer 142 and the third spacer 143. The fourth spacer 144 may extend along at least a part of the side face of the first conductive line 130. For example, the fourth spacer 144 may extend along the side face of the first spacer 141 on which the second spacer 142 is not formed.

The fifth spacer 145 may be formed on the third spacer 143. The fifth spacer 145 may extend along at least a part of the side faces of the first conductive line 130. For example, the fifth spacer 145 may extend along the side faces of the fourth spacer 144. In some example embodiments, a lower side of the fifth spacer 145 may be formed to be lower than a lower side of the fourth spacer 144. For example, the lower portion of the fifth spacer 145 may be in the form of being buried in the third spacer 143.

The first spacer 141, the second spacer 142, the third spacer 143, the fourth spacer 144, and the fifth spacer 145 may each include at least one of silicon oxide, silicon oxynitride, silicon nitride, and combinations thereof, and may include the same or different material. As an example, the first spacer 141 may include silicon nitride, the second spacer 142 may include silicon oxide, the third spacer 143 may include silicon nitride, the fourth spacer 144 may include silicon oxide, and the fifth spacer 145 may include silicon nitride.

In some example embodiments, the spacer structure 140 may include an air spacer. The air spacer 140A may be made up of or may include air or a void, e.g. a void under vacuum. Since the air spacer 140A has a smaller dielectric constant than the silicon oxide, it is possible to effectively reduce the parasitic capacitance of the semiconductor memory device according to some example embodiments. As an example, the fourth spacer 144 may be an air spacer.

The second conductive line 160 may be formed on the first substrate 100 and the first element isolation film 110. The second conductive line 160 may extend long in the second direction X1 across the first active region AR and the first conductive line 130. For example, the second conductive line 160 may diagonally cross the first active region AR and may vertically across the first conductive line 130. The plurality of second conductive lines 160 are spaced apart from each other and may be arranged at equal intervals along the first direction Y1. Each second conductive line 160 may be interposed between the direct contact DC and the buried contact BC to function as a word line WL of the semiconductor memory device according to some example embodiments.

In some example embodiments, the second conductive line 160 may include a fourth sub-conductive pattern 164 and a fifth sub-conductive pattern 166 that are sequentially stacked on the first substrate 100. The fourth sub-conductive pattern 164 and the fifth sub-conductive pattern 166 may each include, for example, but are not limited to, at least one of metal, (doped) polysilicon, and a combination thereof.

The first gate dielectric film 162 may be interposed between the first substrate 100 and the second conductive line 160. The first gate dielectric film 162 may include, for example, but is not limited to, at least one of silicon oxide, silicon oxynitride, silicon nitride, and a high dielectric constant (high-k) material having a higher dielectric constant than silicon oxide.

In some example embodiments, a word line capping pattern 168 may be formed on the second conductive line 160. The word line capping pattern 168 may include, but is not limited to, silicon nitride.

The semiconductor memory device according to some example embodiments may be a memory device including a buried channel array transistor (BCAT). The buried channel array transistor may refer to a structure in which a gate electrode (e.g., a second conductive line 160) is buried in the first substrate 100. For example, the first substrate 100 may include a word line trench WT extending in the second direction X1. The first gate dielectric film 162 may extend along the profile of the word line trench WT. The second conductive line 160 may fill a part of the word line trench WT on the first gate dielectric film 162. The word line capping pattern 168 may fill the other part of the word line trench WT on the second conductive line 160. In such a case, the upper side of the second conductive line 160 may be formed to be lower than the upper side of the first substrate 100.

The first capacitor contact BC, LP may be formed on the first substrate 100 and the first element isolation film 110. The first capacitor contact BC, LP may penetrate the base insulating film 120 to connect the first active region AR of the first substrate 100 and the first capacitor structure 190. In some example embodiments, the first capacitor contact BC, LP may include a buried contact BC and a landing pad LP.

The buried contact BC may penetrate the base insulating film 120 to connect the first active region AR of the first substrate 100 and the landing pad LP. For example, the first substrate 100 may include a second contact trench CT2. The second contact trench CT2 may penetrate the base insulating film 120 to expose a second portion (e.g., both end portions) of the first active region AR. The buried contact BC may be formed in the second contact trench CT2 to connect the second portion of the first active region AR and the landing pad LP.

In some example embodiments, a part of the second contact trench CT2 may also overlap a part of the first element isolation film 110. Accordingly, the second contact trench CT2 may expose not only a part of the first active region AR but also a part of the first element isolation film 110.

The buried contact BC may be formed on the side faces of the spacer structure 140. The buried contact BC may be spaced apart from the first conductive line 130 by the spacer structure 140. In some example embodiments, the upper side of the buried contact BC may be formed to be lower than the upper side of the second bit line capping pattern 139.

The buried contact BC may form a plurality of isolated regions that are spaced apart from each other. For example, as shown in FIG. 4, a plurality of buried contacts BC may be interposed between the plurality of first conductive lines 130 and between the plurality of second conductive lines 160. In some example embodiments, the plurality of buried contacts BC may be placed in the form of a matrix.

The buried contact BC may include a conductive material. The buried contact BC may be electrically connected to the first active region AR of the first substrate 100 accordingly. The second portion (e.g., both end portions) of the first active region AR connected to the buried contact BC may function as a second source/drain region of the semiconductor device, including the second conductive line 160. The buried contact BC may include, for example, but is not limited to, (doped) polysilicon.

The landing pad LP may be formed on the buried contact BC. The landing pad LP may be placed to overlap the buried contact BC. Here, the term 'overlap' means an overlap in the first vertical direction Z1 perpendicular to the upper side of the first substrate 100. The landing pad LP is connected to the upper side of the buried contact BC and may connect the first active region AR and the first capacitor structure 190.

In some example embodiments, the landing pad LP may be placed to overlap a part of the buried contact BC and a part of the first conductive line 130. For example, the landing pad LP may overlap a part of the buried contact BC and a part of the second bit line capping pattern 139. In some example embodiments, the upper side of the landing pad LP may be formed to be higher than the upper side of the second bit line capping pattern 139. In such a case, the landing pad LP may cover a part of the upper side of the second bit line capping pattern 139.

The landing pad LP may form a plurality of isolated regions that are spaced apart from each other. For example, as shown in FIG. 4, a pad trench PT that defines the plurality of landing pads LP may be formed. In some example embodiments, a part of the pad trench PT may expose a part of the second bit line capping pattern 139. For example, the lower side of the pad trench PT may be formed to be lower than the upper side of the second bit line capping pattern 139. In such a case, the plurality of landing pads LP may be separated from each other by the second bit line capping pattern 139 and the pad trench PT. In some example embodiments, the plurality of landing pads LP may be arranged in the form of a honeycomb.

The landing pad LP may include a conductive material. The landing pad LP may be electrically connected to the buried contact BC accordingly. The landing pad LP may include, for example, but is not limited to, tungsten (W).

In some example embodiments, a first upper insulating film 180 that fills the pad trench PT may be formed. The first upper insulating film 180 may be formed on the landing pad LP and the second bit line capping pattern 139. Therefore, the first upper insulating film 180 may define the landing pad LP that forms a plurality of isolated regions.

The first upper insulating film 180 may include an insulating material. The plurality of landing pads LP may be electrically separated from each other accordingly. The first upper insulating film 180 may include, for example, but is not limited to, at least one of silicon oxide, silicon nitride, silicon oxynitride, and a low dielectric constant (low-k) material having a lower dielectric constant than silicon oxide.

The first capacitor structure 190 may be placed on the first upper insulating film 180 and the first capacitor contact BC, LP. The first capacitor structure 190 may be connected to the upper side of the first capacitor contact BC, LP. For example, the first upper insulating film 180 may be patterned to expose at least a part of the upper side of the landing pad LP. The first capacitor structure 190 may be connected to a part of the upper side of the landing pad LP exposed by the first upper insulating film 180. Accordingly, the first capacitor structure 190 may be electrically connected to the second portion (e.g., both end portions) of the first active region AR through the first capacitor contact BC, LP. The first capacitor structure 190 may be controlled by the first conductive line 130 and the second conductive line 160 to store data. In some example embodiments, the plurality of first capacitor structures 190 may be arranged in the form of a honeycomb, e.g. a hexagonal lattice such as a regular hexagonal lattice.

The first capacitor structure 190 may include a first lower electrode 192, a first capacitor dielectric film 194, and a first upper electrode 196. The first capacitor structure 190 may store the electric charge, such as electrons, inside the first capacitor dielectric film 194, using a potential difference generated between the first lower electrode 192 and the first upper electrode 196.

The first lower electrode 192 may be connected to the first capacitor contact BC, LP. For example, the first lower electrode 192 may be connected to a part of the upper side of the landing pad LP exposed by the first upper insulating film 180. Although FIGS. 5 and 7 only show that the first lower electrode 192 has a pillar shape extending from the upper side of the landing pad LP in the first vertical direction Z1, this is just an example. As another example, the first lower electrode 192 may also be in the form of a cylinder extending from the upper side of the landing pad LP in the first vertical direction Z1.

The first capacitor dielectric film 194 may be formed on the first lower electrode 192. In some example embodiments, the first capacitor dielectric 194 may extend along profiles of the side faces and the upper side of the first lower electrode 192 and the profile of the upper side of the first upper insulating film 180.

The first upper electrode 196 may be formed on the first capacitor dielectric film 194. In FIGS. 5 and 7, although the first upper electrode 196 is only shown as filling the region between the adjacent first capacitor structures 190, this is just an example. As another embodiment, the first upper electrode 196 may extend along the profile of the first capacitor dielectric film 194.

The first lower electrode 192, the first capacitor dielectric film 194, and the first upper electrode 196 may each correspond to the lower electrode 30, the capacitor dielectric film 40 and the upper electrode 50 explained above using FIGS. 1 to 3. For example, as shown in FIG. 6, the first lower electrode 192 may include an electrode film 32, a metal oxide film 34 and a doping oxide film 36 that are stacked sequentially. Therefore, detailed description thereof will not be provided below.

Accordingly, it is possible to provide a semiconductor memory device that includes the first capacitor structure 190 having enhanced capacitance and/or reduced stress.

Figure 8:
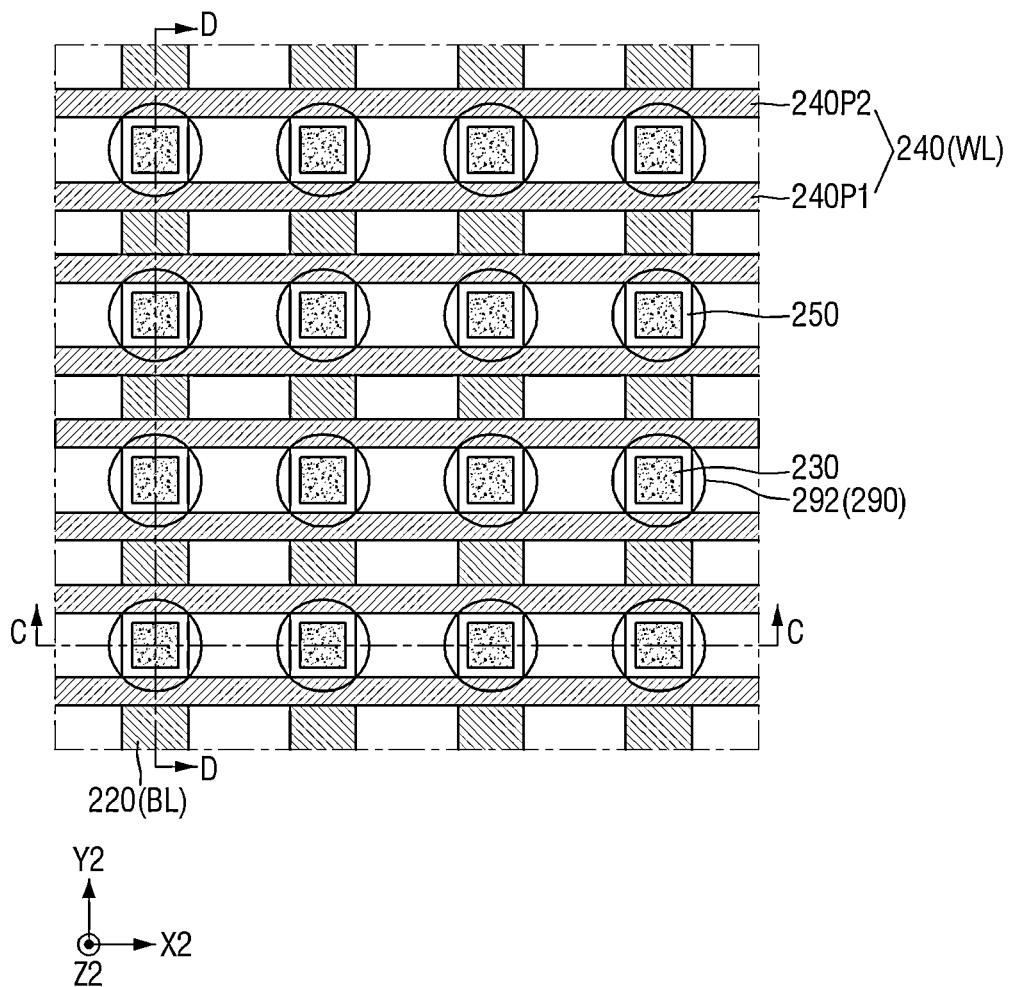
FIG. 8 is another example layout diagram for explaining a semiconductor memory device according to some example embodiments.
Figure 9:
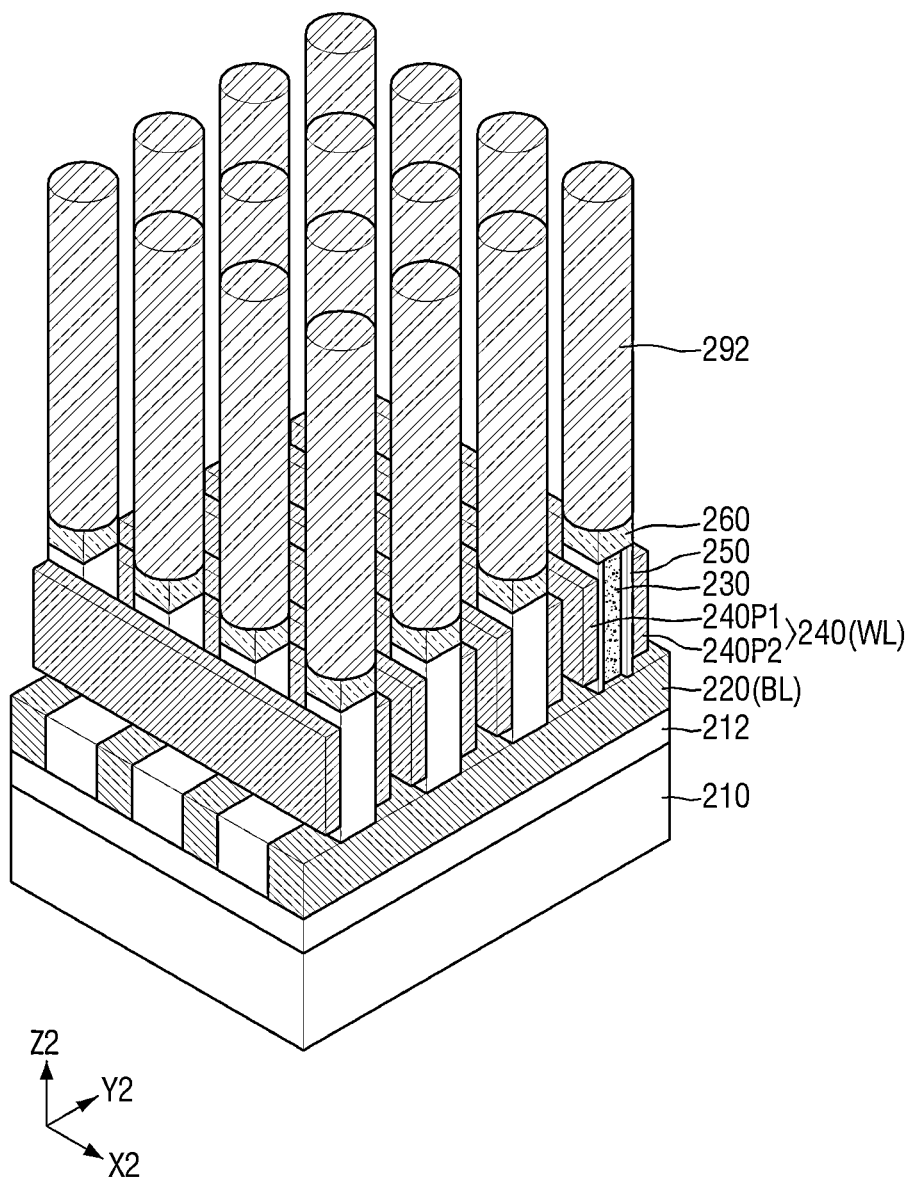
FIG. 9 is a perspective view for explaining the semiconductor memory device of FIG. 8.
Figure 10:
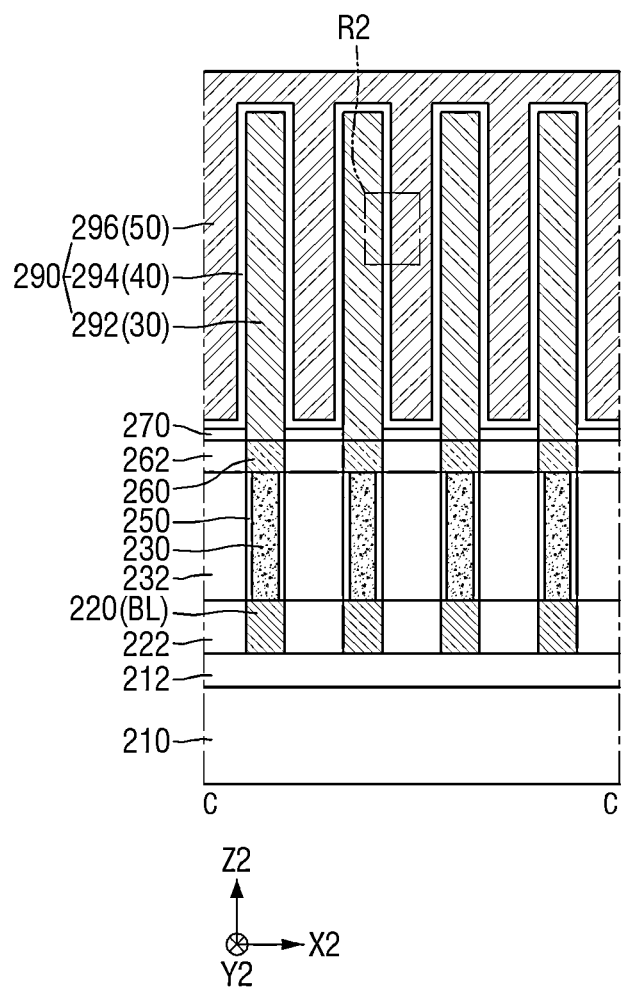
FIG. 10 is a cross-sectional view taken along C-C of FIG. 8.
Figure 11:
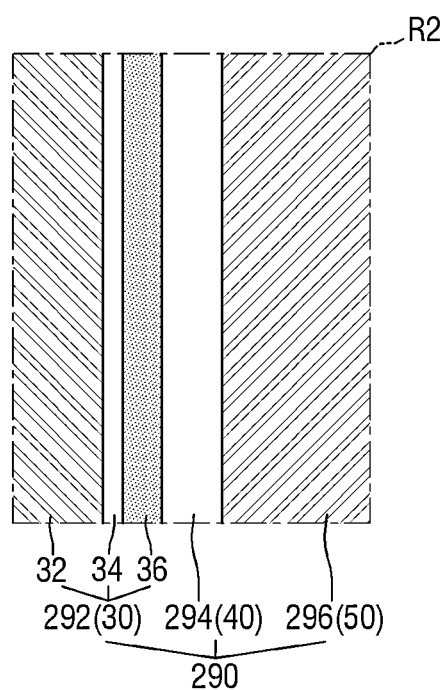
FIG. 11 is an enlarged view for explaining a region R2 of FIG. 10.
Figure 12:
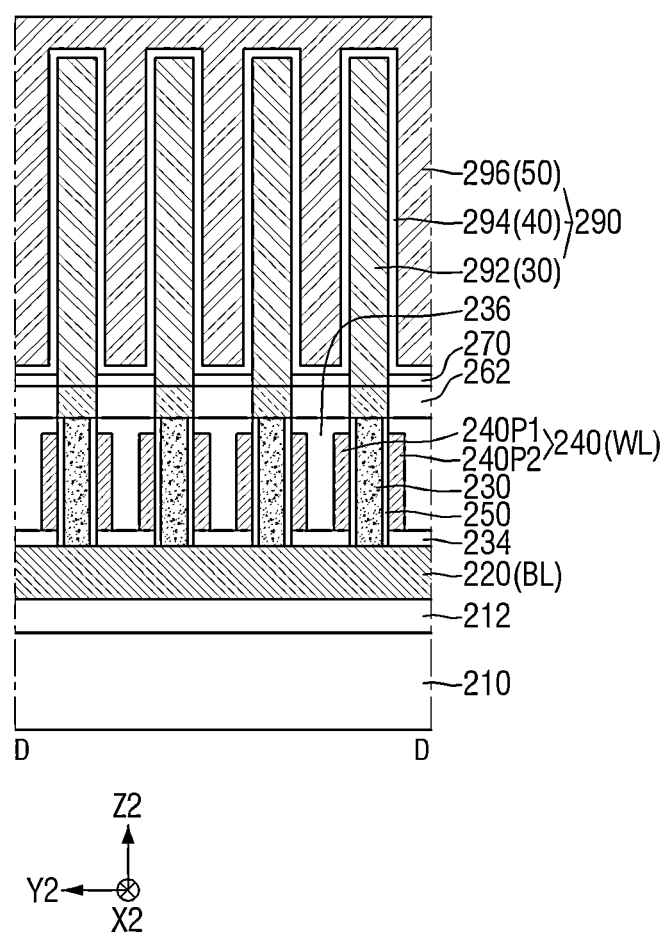
FIG. 12 is a cross-sectional view taken along D-D of FIG. 8.

FIG. 8 is another example layout diagram for explaining a semiconductor memory device according to some example embodiments. FIG. 9 is a perspective view for explaining the semiconductor memory device of FIG. 8. FIG. 10 is a cross-sectional view taken along C-C of FIG. 8. FIG. 11 is an enlarged view for explaining a region R2 of FIG. 10. FIG. 12 is a cross-sectional view taken along D-D of FIG. 8. For convenience of explanation, repeated parts of contents explained above using FIGS. 1 to 3 will be briefly explained or omitted.

Referring to FIGS. 8 to 12, the semiconductor memory device according to some example embodiments include a second substrate 210, a third conductive line 220, a channel layer 230, a fourth conductive line 240, a second gate dielectric film 250, and a second capacitor structure 290. The semiconductor memory device according to some example embodiments may be a memory device including a vertical channel transistor (VCT). The vertical channel transistor may refer to a structure in which a channel length of the channel layer (e.g., the channel layer 230) extends in a second vertical direction Z2 perpendicular to the upper side of the second substrate 210.

A first lower insulating film 212 may be placed on the second substrate 210, and a plurality of third conductive lines 220 may be spaced apart from each other in a fifth direction X2 on the first lower insulating film 212, and may each extend in a fourth direction Y2. A plurality of first insulating patterns 222 may be placed on the first lower insulating film 212 to fill a space between the plurality of first conductive lines 220. The plurality of first insulating patterns 222 may extend in the fourth direction Y2, and the upper sides of the plurality of first insulating patterns 222 may be placed at the same level as the upper sides of the plurality of third conductive lines 220. Each third conductive line 220 may function as a bit line BL (e.g. a column) of the semiconductor memory device according to some example embodiments.

In some example embodiments, the plurality of third conductive lines 220 may include doped polysilicon, metal, conductive metal nitride, conductive metal silicide, conductive metal oxide or a combination thereof. For example, the plurality of third conductive lines 220 may be made up of, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or a combination thereof. The plurality of third conductive lines 220 may include a single layer or multiple layers of the aforementioned materials. In some example embodiments, the plurality of third conductive lines 220 may include a two-dimensional semiconductor material, and the two-dimensional semiconductor material may include, for example, graphene, carbon nanotubes or combinations thereof.

The channel layer 230 may be arranged in the form of a matrix that is spaced apart in the fourth direction Y2 and the fifth direction X2 on the plurality of third conductive lines 220. The channel layer 230 may have a first width along the fifth direction X2 and a first height along the second vertical direction Z2, and the first height may be larger than the first width. For example, the first height may be, but is not limited to, about 2 to 10 times the first width. A lower portion of the channel layer 230 may function as a first source/drain region (not shown), an upper portion of the channel layer 230 may function as a second source/drain region (not shown), and the channel layer 230 between the first source/drain region and the second source/drain region may function as a channel region (not shown).

In some example embodiments, the channel layer 230 may include an oxide semiconductor, for example, $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$ or combinations thereof. The channel layer 230 may include a single layer or multiple layers of the oxide semiconductor. In some example embodiments, the channel layer 230 may have a bandgap energy that is greater than the bandgap energy of silicon. For example, the channel layer 230 may have bandgap energy of about 1.5 eV to 5.6 eV. For example, the channel layer 230 may have optimum or improved channel performance when having bandgap energy of about 2.0 eV to 4.0 eV. For example, the channel layer 230 may be, but is not limited to, polycrystalline or amorphous. In some example embodiments, the channel layer 230 may include a two-dimensional semiconductor material, for example, graphene, carbon nanotubes or a combination thereof.

The fourth conductive line 240 may extend in the fifth direction X2 on the both side walls of the channel layer 230. The plurality of fourth conductive lines 240 may be spaced apart from each other in the fourth direction Y2 and may each extend in the fifth direction X2. Each fourth conductive line 240 may function as a word line WL of the semiconductor memory device according to some example embodiments.

In some example embodiments, the fourth conductive line 240 may include a first sub-gate electrode 240P1 facing a first side wall of the channel layer 230, and a second sub-gate electrode 240P2 facing a second side wall opposite to the first side wall of the channel layer 230. As the single channel layer 230 is placed between the first sub-gate electrode 240P1 and the second sub-gate electrode 240P2, the semiconductor memory device according to some example embodiments may have a dual gate transistor structure. However, this is only an example, and the second sub-gate electrode 240P2 may be omitted, and only the first sub-gate electrode 240P1 facing the first side wall of the channel layer 230 may be formed to implement a single gate transistor structure.

The fourth conductive line 240 may include doped polysilicon, metal, conductive metal nitride, conductive metal silicide, conductive metal oxide or a combination thereof. For example, the fourth conductive line 240 may be made up of, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or a combination thereof.

The second gate dielectric film 250 may surround the side walls of the channel layer 230 and be interposed between the channel layer 230 and the fourth conductive line 240. For example, as shown in FIG. 8, the entire side walls of the channel layer 230 may be surrounded by the second gate dielectric film 250, and a part of the side walls of the fourth conductive line 240 may come into contact with the second gate dielectric film 250. In some other embodiments, the second gate dielectric film 250 extends in an extension direction (i.e., the fifth direction X2) of the fourth conductive line 240, and among the side walls of the channel layer 230, only the two side walls facing the fourth conductive line 240 may come into contact with the second gate dielectric film 250.

In some example embodiments, the second gate dielectric film 250 may be made up of a silicon oxide film, a silicon oxynitride film, a high dielectric constant film having a higher dielectric constant than the silicon oxide film, or a combination thereof. The high dielectric constant film may be made up of a metal oxide or a metal oxide nitride. For example, the high dielectric constant film that may be used as the second gate dielectric film 250 may be, but is not limited to, $HfO_2$, HfSiO, HfSiON, HfTaO, HfTiO, HfZrO, $ZrO_2$, $Al_2O_3$ or a combination thereof.

A plurality of second insulating patterns 232 may extend along the fourth direction Y2 on the plurality of first insulating patterns 222, and the channel layer 230 may be placed between two adjacent second insulating patterns 232 among the plurality of second insulating patterns 232. In addition, a first buried layer 234 and a second buried layer 236 may be placed in the space between the two adjacent channel layers 230, between the two adjacent second insulating patterns 232. The first buried layer 234 is placed at the lower portion of the space between the two adjacent channel layers 230, and the second buried layer 236 may be formed to fill the rest of the space between the two adjacent channel layers 230 on the first buried layer 234. The upper side of the second buried layer 236 is placed at the same level as the upper side of the channel layer 230, and the second buried layer 236 may cover the upper side of the fourth conductive line 240. Unlike this, a plurality of second insulating patterns 232 are formed by a material layer that is continuous with a plurality of first insulating patterns 222, or the second buried layer 236 may also be formed of a material layer that is continuous with the first buried layer 234.

A second capacitor contact 260 may be placed on the channel layer 230. The second capacitor contact 260 is placed to vertically overlap the channel layer 230, and may be arranged in the form of a matrix spaced apart in the fourth direction Y2 and the fifth direction X2. The second capacitor contact 260 may be made up of, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$ or a combination thereof.

The second upper insulating film 262 may surround the side walls of the second capacitor contact 260 on the plurality of second insulating patterns 232 and the second buried layer 236. The etching stop film 270 may be placed on the second upper insulating film 262, and the second capacitor structure 290 may be placed on the etching stop film 270. The second capacitor structure 290 may include a second lower electrode 292, a second capacitor dielectric film 294, and a second upper electrode 296.

The second lower electrode 292 may penetrate the etching stop film 270 and be electrically connected to the upper side of the second capacitor contact 260. The second lower electrode 292 may be formed, but is not limited to, in the form of a pillar extending in the second vertical direction Z2. In some example embodiments, the second lower electrode 292 may be arranged in the form of a matrix which is placed to vertically overlap the second capacitor contact 260, and placed to be spaced apart in the fourth direction Y2 and the fifth direction X2. Unlike this, a landing pad (not shown) may be further placed between the second capacitor contact 260 and the second lower electrode 292, and the second lower electrode 292 may also be arranged in the form of a honeycomb, e.g. a hexagonal lattice such as a regular hexagonal lattice.

The second lower electrode 292, the second capacitor dielectric film 294, and the second upper electrode 296 may correspond to the lower electrode 30, the capacitor dielectric film 40 and the upper electrode 50 explained above using FIGS. 1 to 3. For example, as shown in FIG. 11, the second lower electrode 292 may include an electrode film 32, a metal oxide film 34 and a doping oxide film 36 that are stacked sequentially. Therefore, detailed description thereof will not be provided below.

Accordingly, it is possible to provide a semiconductor memory device that includes the second capacitor structure 290 having enhanced capacitance and reduced stress.

Figure 13:
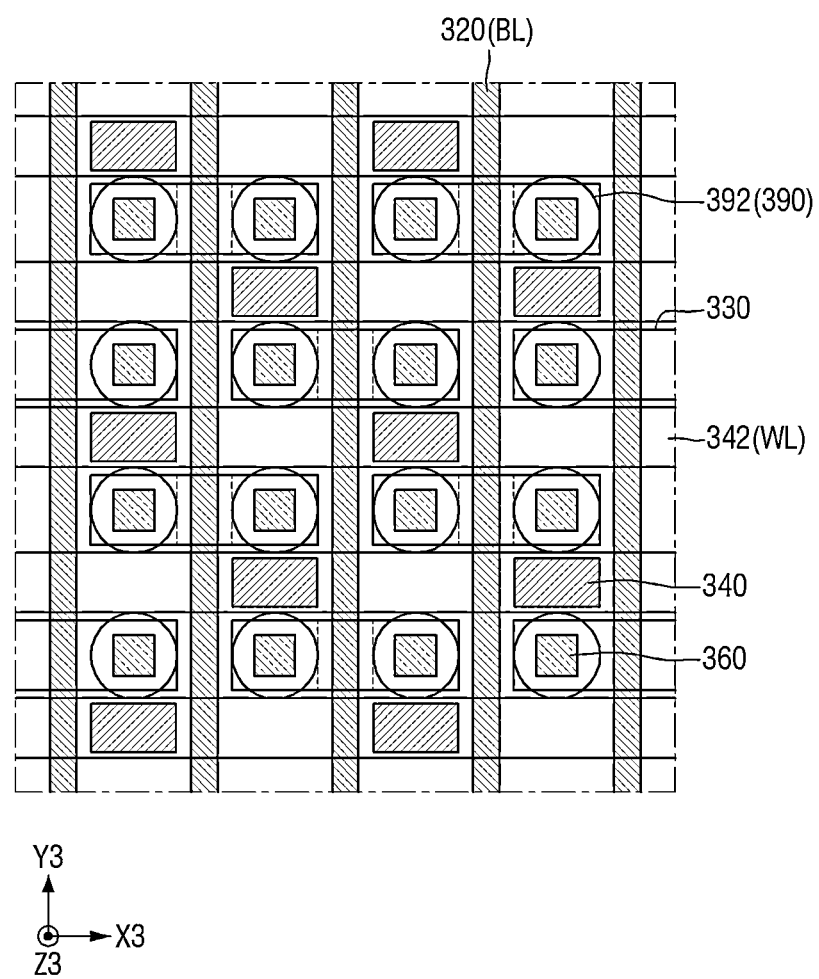
FIG. 13 is still another example layout diagram for explaining a semiconductor memory device according to some example embodiments.
Figure 14:
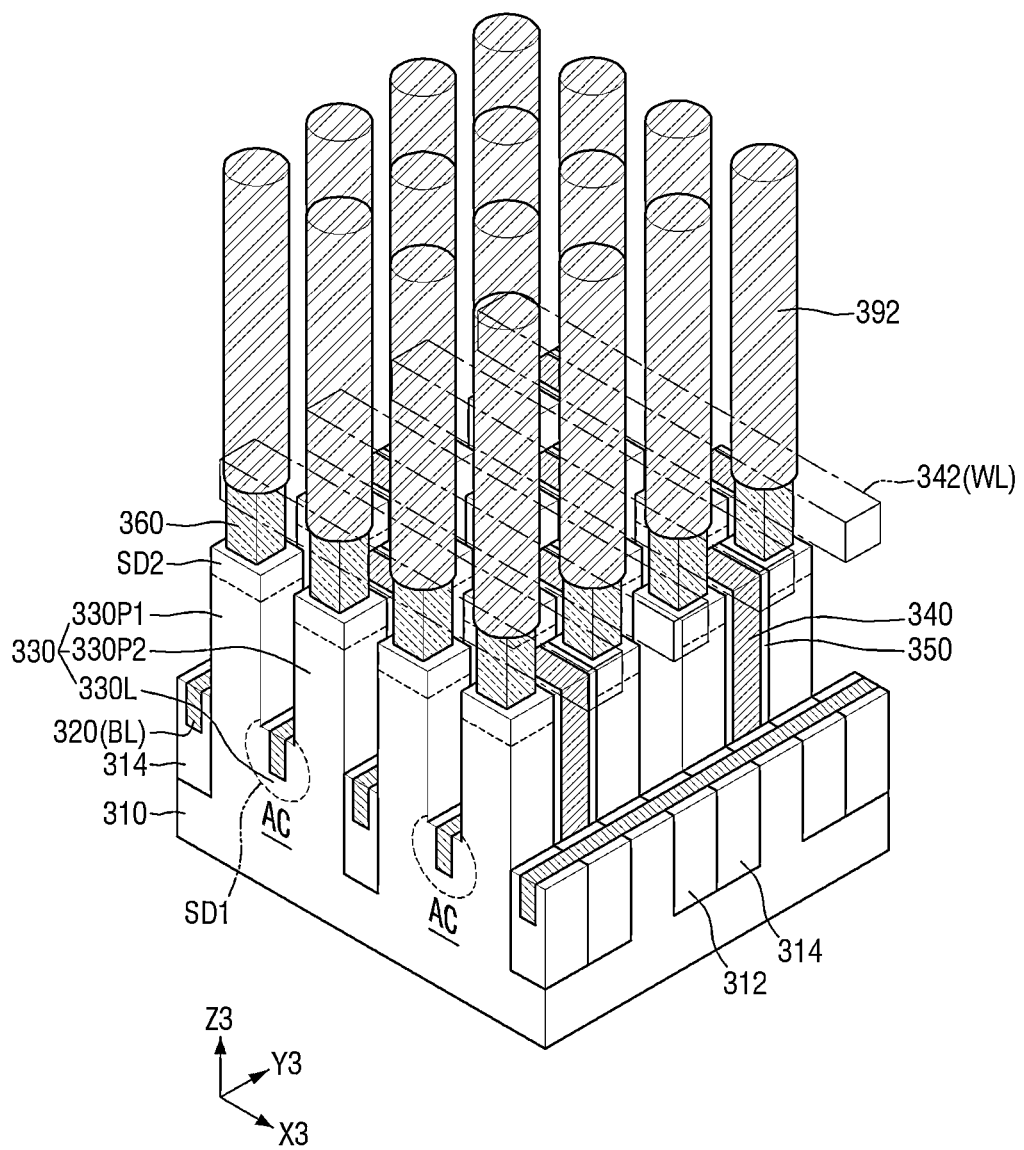
FIG. 14 is a perspective view for explaining the semiconductor memory device of FIG. 13.

FIG. 13 is still another example layout diagram for explaining a semiconductor memory device according to some example embodiments. FIG. 14 is a perspective view for explaining the semiconductor memory device of FIG. 13. For convenience of explanation, repeated parts of contents explained above using FIGS. 1 to 3 will be briefly explained or omitted.

Referring to FIGS. 13 and 14, the semiconductor memory device according to some example embodiments may include a third substrate 310, a fifth conductive line 320, a channel structure 330, a contact gate electrode 340, a sixth conductive line 342 and a third capacitor structure 390. The semiconductor memory device according to some example embodiments may be a memory device that includes a vertical channel transistor (VCT). The vertical channel transistor may refer to a structure in which a channel length of a channel layer (e.g., the channel structure 330) extends in a third vertical direction Z3 perpendicular to the upper side of the third substrate 310.

A plurality of second active regions AC may be defined on the third substrate 310 by a second element isolation film 312 and a third element isolation film 314. The channel structure 330 may be placed inside each second active region AC. In some example embodiments, the channel structure 330 may include a first active pillar 330P1 and a second active pillar 330P2 each extending in the third vertical direction Z3, and a connecting portion 330L connected to the lower portion of the first active pillar 330P1 and the lower portion of the second active pillar 330P2. A first source/drain region SD1 may be placed inside the connecting portion 330L, and a second source/drain region SD2 may be placed above the first and second active pillars 230A1 and 230A2. The first active pillar 330P1 and the second active pillar 330P2 may each form an independent unit memory cell.

The fifth conductive line 320 may extend in a direction that intersects each of the plurality of second active regions AC, for example, a sixth direction Y3. The plurality of fifth conductive lines 320 may be spaced apart from each other in a seventh direction X3 and may each extend in the sixth direction Y3. A single fifth conductive line 320 among the plurality of fifth conductive lines 320 may be placed on the connecting portion 330L between the first active pillar 330P1 and the second active pillar 330P2. Further, the single fifth conductive line 320 may be placed on the first source/drain region SD1. The other fifth conductive line 320 adjacent to the single fifth conductive line 320 may be placed between the two channel structures 330. The single fifth conductive line 320 among the plurality of fifth conductive lines 320 may function as a common bit line BL included in two unit memory cells formed by the first active pillar 330P1 and the second active pillar 330P2 placed on both sides of the single fifth conductive line 320.

A single contact gate electrode 340 may be placed between two channel structures 330 adjacent to each other in the sixth direction Y3. For example, the contact gate electrode 340 may be placed between the first active pillar 330P1 included in the single channel structure 330 and the second active pillar 330P2 of the channel structure 330 adjacent thereto, and the single contact gate electrode 340 may be shared by the first active pillar 330P1 and the second active pillar 330P2 placed on both side walls. A gate insulating layer 250A may be placed between the contact gate electrode 340 and the first active pillar 330P1 and between the contact gate electrode 340 and the second active pillar 330P2.

The sixth conductive line 342 may extend in the seventh direction X3 on the upper side of the contact gate electrode 340. The plurality of sixth conductive lines 342 may be spaced apart from each other in the sixth direction Y3 and may each extend in the seventh direction X3. Each sixth conductive line 342 may function as the word line WL of the semiconductor memory device according to some example embodiments.

A third capacitor contact 360 may be placed on the channel structure 330. The third capacitor contact 360 may be placed on the second source/drain region SD2, and a third capacitor structure 390 may be placed on the third capacitor contact 360. The third capacitor structure 390 may include a third lower electrode 392, a third capacitor dielectric film (not shown), and a third upper electrode (not shown).

The third capacitor structure 390 may correspond to the capacitor structure CS explained above using FIGS. 1 to 3. Therefore, detailed description thereof will not be provided below.

Accordingly, it is possible to provide a semiconductor memory device that includes a third capacitor structure 390 having enhanced capacitance and/or reduced stress.

Hereinafter, a capacitor structure according to the example embodiment will be described referring to FIGS. 1 to 3 and 15 to 21.

FIGS. 15 to 21 are intermediate stage diagrams for explaining a method for fabricating a capacitor structure according to some example embodiments. For convenience of explanation, repeated parts of contents explained above using FIGS. 1 to 3 will be briefly explained or omitted.

Figure 15:
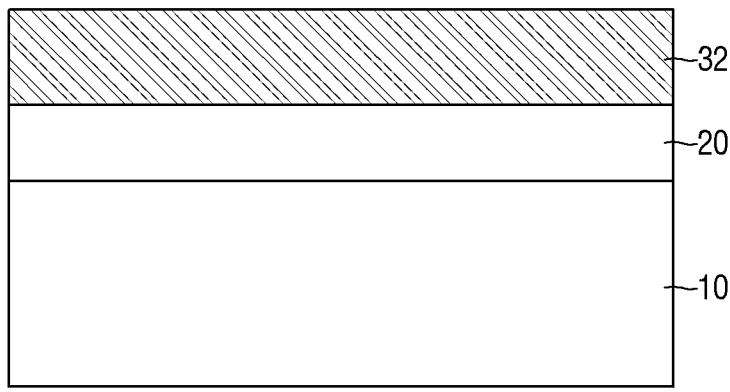
FIGS. 15 to 21 are intermediate stage diagrams for explaining a method for fabricating a capacitor structure according to some example embodiments.

Referring to FIG. 15, a lower insulating film 20 and an electrode film 32 are formed on the substrate 10.

The lower insulating film 20 may be formed on the substrate 10. The lower insulating film 20 may include, for example, at least one of silicon oxide, silicon nitride, silicon oxynitride, and a low dielectric constant (low-k) material having a lower dielectric constant than silicon oxide. The lower insulating film 20 may be formed with, for example, at least one of an atomic layer deposition (ALD) process or a chemical vapor deposition (CVD) process such as a plasma enhanced chemical vapor deposition (PECVD) process; however, example embodiments are not limited thereto.

The electrode film 32 may be formed on the lower insulating film 20. The electrode film 32 may include a first metal element. The first metal element may include, for example, but is not limited to, at least one of titanium (Ti), tantalum (Ta), tungsten (W), and ruthenium (Ru). In some example embodiments, the electrode film 32 may include a nitride of the first metal element. The electrode film 32 may be formed with, for example, at least one of an ALD process, a CVD process such as a PCVD process, or a sputtering process such as a physical vapor deposition (PVD) process; however, example embodiments are not limited thereto.

Figure 16:
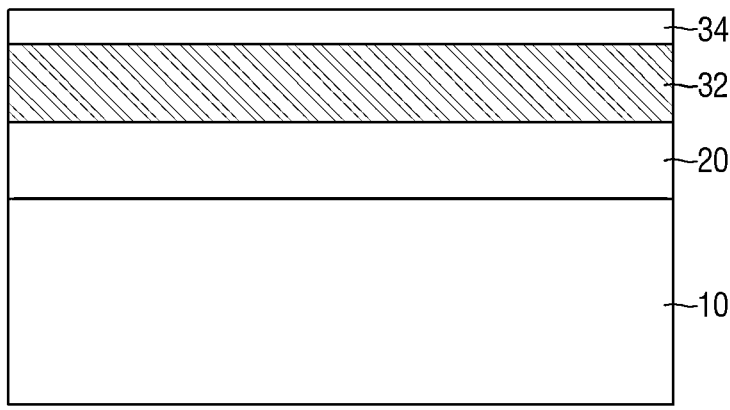

Referring to FIG. 16, a metal oxide film 34 is formed on the electrode film 32.

The metal oxide film 34 may cover the electrode film 32. The metal oxide film 34 may include an oxide of the first metal element. The metal oxide film 34 may be formed by, but is not limited to, the oxidation process on the electrode film 32. Alternatively, the metal oxide film 34 may be a natural oxide film of the electrode film 32.

In some example embodiments, formation of the metal oxide film 34 may include performing a low-temperature oxidation process on the electrode film 32. The low-temperature oxidation process may be performed, for example, at a temperature of room temperature to 200° C. or lower.

Figure 17:
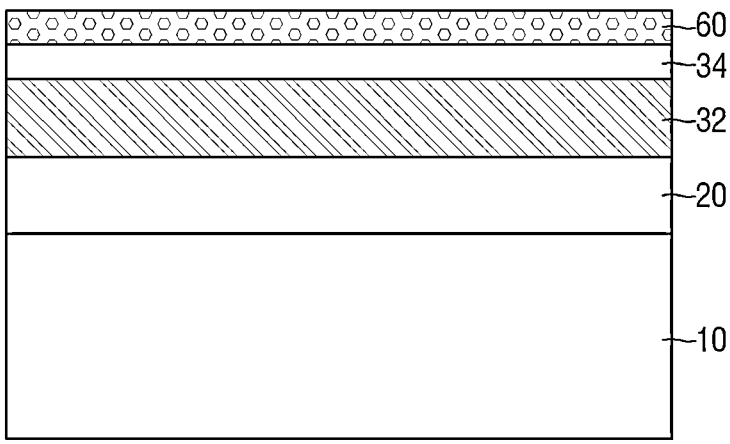

Referring to FIG. 17, a blocking film 60 is formed on the metal oxide film 34.

The blocking film 60 may cover the metal oxide film 34. The blocking film 60 may include impurity element. The impurity element may include at least one of silicon (Si), aluminum (Al), zirconium (Zr) and hafnium (Hf).

In some example embodiments, the blocking film 60 may include oxides of the impurity element. For example, the blocking film 60 may include at least one of silicon oxide, aluminum oxide, zirconium oxide and hafnium oxide. Although the blocking film 60 is only shown as a single film, this is just an example, and the blocking film 60 may also be multiple films.

The blocking film 60 may be formed, for example, by a chemical vapor deposition (CVD) process and/or an atomic layer deposition (ALD) process. As an example, when the blocking film 60 includes silicon oxide, the blocking film 60 may be formed by a chemical vapor deposition (CVD) process and/or an atomic layer deposition (ALD) process that utilizes a silicon (Si) precursor.

Figure 18:
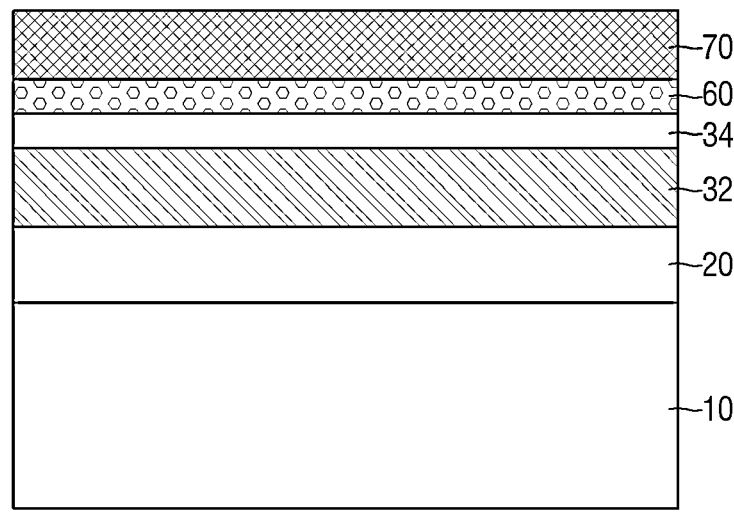

Referring to FIG. 18, a dopant film 70 is formed on the blocking film 60.

The dopant film 70 may cover the blocking film 60. The dopant film 70 may include a second metal element. For example, the dopant film 70 may include the second metal element, an oxide of the second metal element or a nitride of the second metal element. The dopant film 70 may be formed, for example, but is not limited to, by a vapor deposition process (e.g., a chemical vapor deposition (CVD) process and/or an atomic layer deposition (ALD) process).

In some example embodiments, the second metal element may include at least one of Group 5 to Group 11 and Group 15 metal elements. For example, the second metal element may include, but is not limited to, at least one of antimony (Sb), molybdenum (Mo), cobalt (Co), niobium (Nb), copper (Cu), nickel (Ni), and tantalum (Ta).

In the method for fabricating the capacitor structure according to some example embodiments, the impurity element of the blocking film 60 may prevent excessive oxidation of the electrode film 32 or the metal oxide film 34 in the process of forming the dopant film 70. For example, the metal oxide film 34 including titanium oxide or the like has a grain structure in which oxygen atoms (O) are easily diffused. Also, for example, ozone ($O_3$) reactant used to form the dopant film 70 causes excessive oxidation of the electrode film 32 or the metal oxide film 34. However, as described above, the blocking film 60 may be interposed between the metal oxide film 34 and the dopant film 70 to prevent the metal oxide film 34 from being excessively oxidized. For example, the impurity atom of the blocking film 60 has a strong bonding force with the oxygen atom O or may prevent the oxygen atom O from being diffused to the metal oxide film 34.

Figure 19:
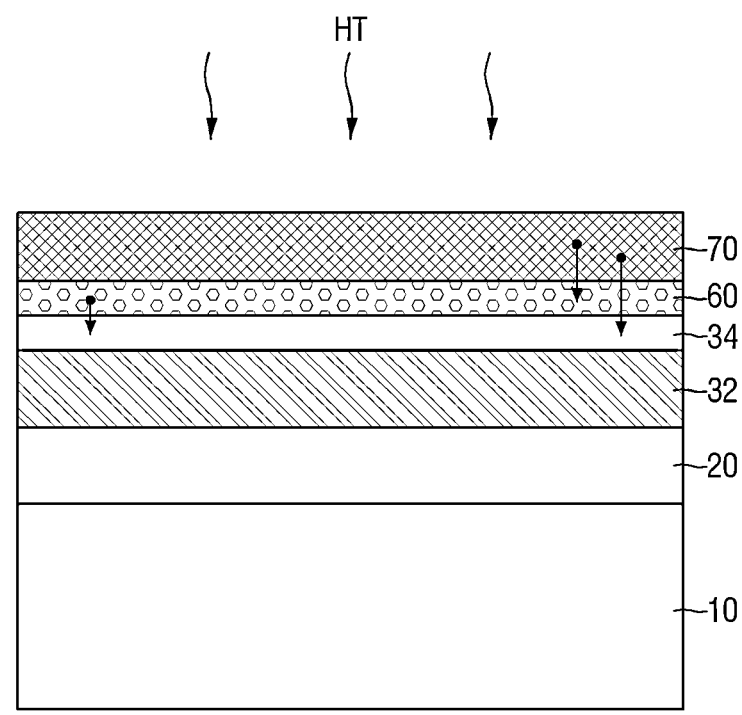
Figure 20:
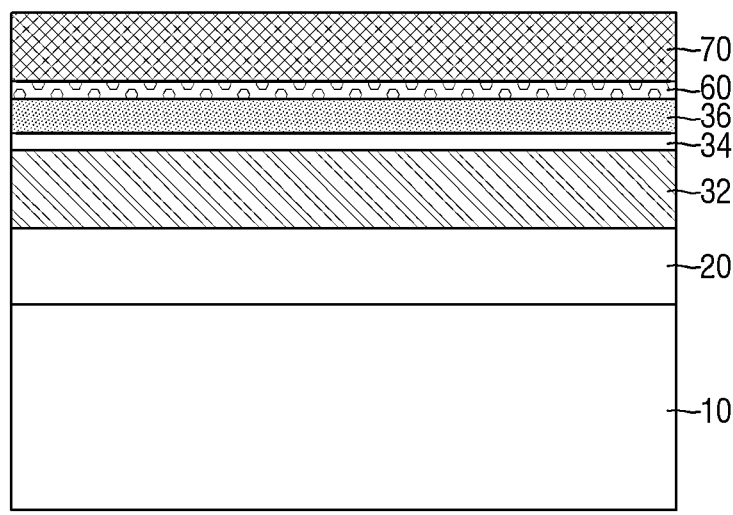

Referring to FIG. 19, a heat treatment process (HT) is performed.

The heat treatment process (HT) may include, for example, an annealing process. In some example embodiments, the heat treatment process (HT) may be performed at a temperature of about 200° C. or higher. For example, the heat treatment process (HT) may include an annealing process performed at a temperature of about 200° C. to about 700° C.

Through the heat treatment process (HT), at least a part of the second metal element of the dopant film 70 may be diffused to the metal oxide film 34 via the blocking film 60. Accordingly, referring to FIG. 20, a doping oxide film 36 doped with the second metal element may be formed. As an example, the doping oxide film 36 including titanium oxide doped with the second metal element may be formed between the electrode film 32 and the blocking film 60.

In some example embodiments, the doping oxide film 36 may further include the impurity element of the blocking film 60. For example, at least a part of the impurity element (e.g., silicon (Si)) of the blocking film 60 may be diffused into the metal oxide film 34 through the heat treatment process (HT). In such a case, at least a part of the impurity element may remain in the doping oxide film 36 formed. Alternatively or additionally, through the heat treatment process (HT), at least a part of the first metal element of the metal oxide film 34 is diffused into the blocking film 60 to form a part of the doping oxide film 36. Accordingly, for example, a doping oxide film 36 including titanium oxide doped with the second metal element and silicon (Si) may be formed between the electrode film 32 and the blocking film 60.

In some example embodiments, at least a part of the second metal element of the dopant film 70 may be diffused up to the lower side of the metal oxide film 34 via the blocking film 60. In such a case, the doping oxide film 36 explained above using FIG. 3A may be formed.

Figure 21:
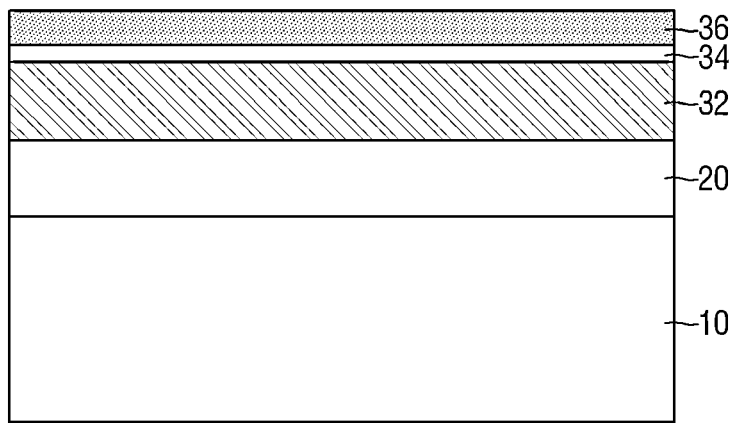

Referring to FIG. 21, the blocking film 60 and the dopant film 70 are removed.

The doping oxide film 36 may be exposed with the removal of the blocking film 60 and the dopant film 70. Removal of the blocking film 60 and the dopant film 70 may include, for example, performing a cleaning process. The cleaning process may be performed using, for example, but is not limited to, a wet chemical process using hydrogen fluoride (HF).

Subsequently, referring to FIG. 1, the capacitor dielectric film 40 and the upper electrode 50 are sequentially formed on the doping oxide film 36. Accordingly, the capacitor structure CS including the lower electrode 30, the capacitor dielectric film 40 and the upper electrode 50 may be formed.

The capacitor dielectric film 40 may include, for example, at least one of silicon oxide, silicon nitride, silicon oxynitride, and a high dielectric constant (high-k) material having a higher dielectric constant than silicon oxide.

The upper electrode 50 may include, for example, at least one of titanium, titanium nitride, tantalum, tantalum nitride, tungsten, tungsten nitride, and ruthenium. In some example embodiments, the upper electrode 50 may include the first metal element. As an example, the upper electrode 50 may include titanium nitride.

Accordingly, it is possible to provide a method for fabricating a capacitor structure CS having enhanced capacitance and reduced stress.

Hereinafter, the capacitor structure according to the example embodiments will be described referring to FIGS. 4 to 7 and 22 to 24.

Figure 22:
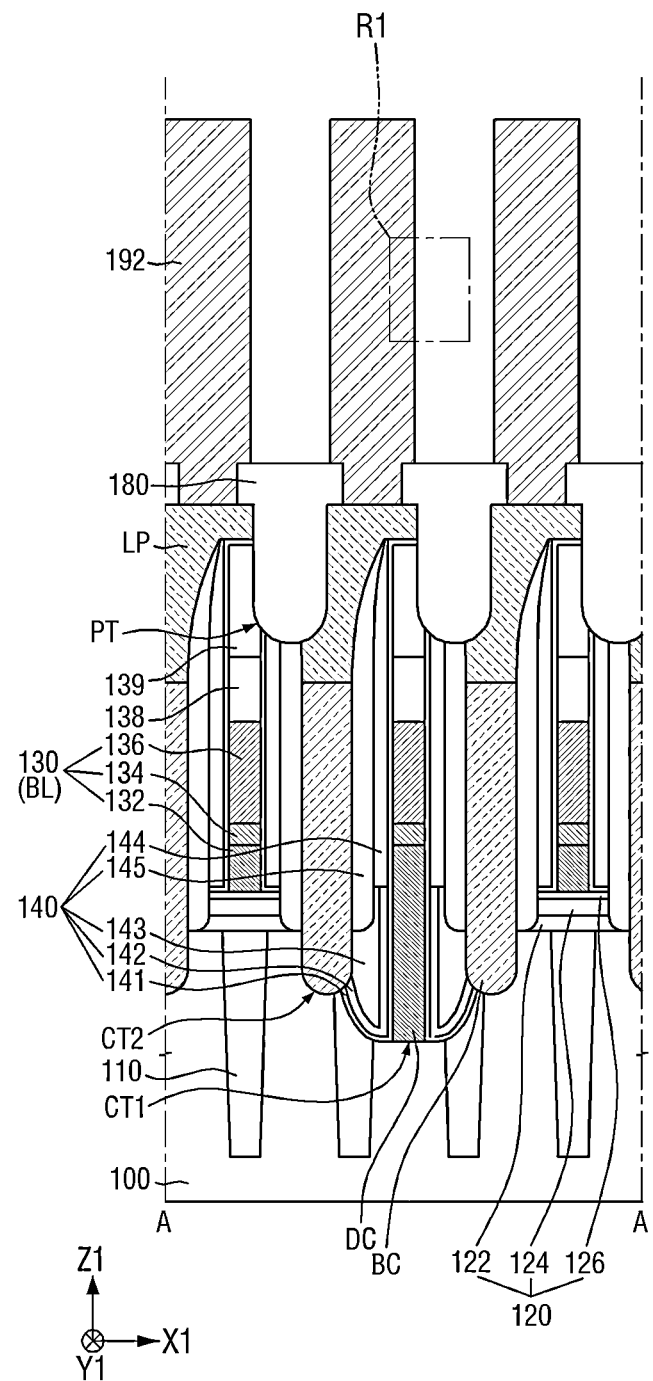
FIGS. 22 to 24 are intermediate stage diagrams for explaining a method for fabricating the semiconductor device according to some example embodiments.
Figure 23:
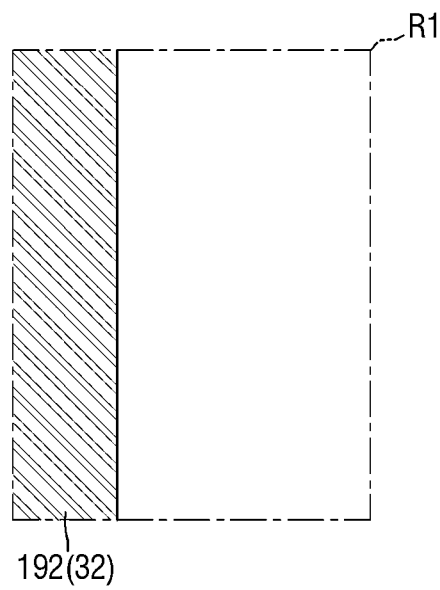
Figure 24:
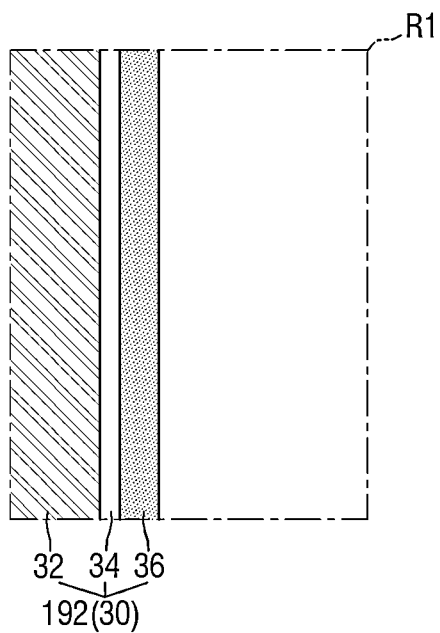

FIGS. 22 to 24 are intermediate stage diagrams for explaining a method for fabricating the semiconductor device according to some example embodiments. For convenience of explanation, repeated parts of contents explained above using FIGS. 4 to 7, 15 to 21 will be briefly explained or omitted. For reference, FIG. 23 is an enlarged view for explaining a region R1 of FIG. 22.

Referring to FIGS. 4, 22 and 23, the base insulating film 120, the first conductive line 130 (BL), the direct contact (DC), the spacer structure 140, the second conductive line 160 (WL), the first gate dielectric film 162, the first capacitor contact BC, LP, and the first lower electrode 192 are formed on the first substrate 100 and the first element isolation film 110.

The first lower electrode 192 may be connected to the first capacitor contact BC, LP. For example, the electrode film 32 that covers the landing pads LP and the first upper insulating film 180 may be formed. Subsequently, a patterning process of patterning the electrode film 32 may be performed. Accordingly, a plurality of first lower electrodes 192 each including the electrode films 32 connected to the respective landing pads LP may be formed.

Referring to FIG. 24, the metal oxide film 34 and the doping oxide film 36 are formed sequentially on the electrode film 32. Accordingly, the first lower electrode 192 including the electrode film 32, the metal oxide film 34 and the doping oxide film 36 may be formed. Since the formation of the metal oxide film 34 and the doping oxide film 36 is similar to that explained above using FIGS. 16 to 21, detailed description thereof will not be provided below.

Subsequently, referring to FIGS. 4 and 5, the first capacitor dielectric film 194 and the first upper electrode 196 are sequentially formed on the doping oxide film 36. Accordingly, the first capacitor structure 190 including the first lower electrode 192, the first capacitor dielectric film 194 and the first upper electrode 196 may be formed. Since formation of the first capacitor dielectric film 194 and the first upper electrode 196 is similar to that explained above using FIG. 1, detailed description thereof will not be provided below.

Accordingly, it is possible to provide a method for fabricating a semiconductor memory device that includes the first capacitor structure 190 having enhanced capacitance and/or reduced stress.

While inventive concepts have been particularly shown and described with reference to example embodiments thereof, it will be understood by those of ordinary skill in the art that various changes in form and details may be made therein without departing from the spirit and scope of inventive concepts as defined by the following claims. Example embodiments are not necessarily mutually exclusive with one another. For example, some example embodiments may include features described with reference to one or more figures, and may also include features described with reference to one or more other figures. It is therefore desired that the present embodiments be considered in all respects as illustrative and not restrictive, reference being made to the appended claims rather than the foregoing description to indicate the scope of the invention.

What is claimed is:

1. A capacitor structure comprising:
a lower electrode;
an upper electrode; and
a capacitor dielectric film between the lower electrode and the upper electrode,
wherein the lower electrode includes an electrode film including a first metal element, and the lower electrode includes a doping oxide film including an oxide of the first metal element between the electrode film and the capacitor dielectric film,
the doping oxide film further includes a second metal element including an impurity element including at least one of silicon (Si), aluminum (Al), zirconium (Zr) and hafnium (Hf), and the doping oxide film includes at least one of Group 5 to Group 11 or Group 15 metal elements,
the lower electrode further includes a metal oxide film including an oxide of the first metal element and not including the second metal element,
the metal oxide film is between the electrode film and the doping oxide film,
the metal oxide film has a first thickness, and
the doping oxide film has a second thickness that is larger than the first thickness.

2. The capacitor structure of claim 1, wherein the lower electrode further includes a metal oxide film including an oxide of the first metal element and not including the second metal element, the metal oxide film between the electrode film and the doping oxide film.

3. The capacitor structure of claim 2, wherein the metal oxide film further includes the impurity element.

4. The capacitor structure of claim 1, wherein the first metal element includes at least one of titanium (Ti), tantalum (Ta), tungsten (W) and ruthenium (Ru).

5. The capacitor structure of claim 4, wherein the doping oxide film further includes a nitride of the first metal element.

6. The capacitor structure of claim 1, wherein the second metal element includes at least one of antimony (Sb), molybdenum (Mo), cobalt (Co), niobium (Nb), copper (Cu), nickel (Ni) and tantalum (Ta).

7. The capacitor structure of claim 1, wherein the doping oxide film includes the second metal element of 10 atomic % or less.

8. The capacitor structure of claim 1, wherein the impurity element includes silicon (Si).

9. The capacitor structure of claim 1, wherein the doping oxide film includes the impurity element of 0.3 atomic % or less.

10. A capacitor structure comprising:
    a lower electrode;
    an upper electrode; and
    a capacitor dielectric film between the lower electrode and the upper electrode,
    wherein the lower electrode includes an electrode film including a first metal element, the lower electrode includes a metal oxide film including an oxide of the first metal element between the electrode film and the capacitor dielectric film, and the lower electrode includes a doping oxide film including an oxide of the first metal element doped with a second metal element, the doping oxide film between the metal oxide film and the capacitor dielectric film, and
    the doping oxide film further includes silicon (Si) of 0.3 atomic % or less,
    the metal oxide film has a first thickness, and
    the doping oxide film has a second thickness that is larger than the first thickness.

11. The capacitor structure of claim 10, wherein the first metal element includes at least one of titanium (Ti), tantalum (Ta), tungsten (W) and ruthenium (Ru).

12. The capacitor structure of claim 10, wherein the second metal element includes at least one of Group 5 to Group 11 and Group 15 metal elements.

13. The capacitor structure of claim 10, wherein the doping oxide film includes the second metal element of 1 atomic % or less.

14. The capacitor structure of claim 10, wherein a thickness of the doping oxide film is 0.1 nm or less.

15. The capacitor structure of claim 10, wherein the capacitor dielectric film includes at least one of aluminum oxide, zirconium oxide and hafnium oxide.

16. The capacitor structure of claim 10, wherein the upper electrode includes the first metal element.

* * * * *